(12) United States Patent
Han et al.

(10) Patent No.: US 9,722,653 B2
(45) Date of Patent: Aug. 1, 2017

(54) MEMORY CARD ADAPTER

(71) Applicants: Seok-jae Han, Seongnam-si (KR); Jeongsik Yoo, Hwasung (KR); So-Young Jung, Seongnam-si (KR)

(72) Inventors: Seok-jae Han, Seongnam-si (KR); Jeongsik Yoo, Hwasung (KR); So-Young Jung, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 24 days.

(21) Appl. No.: 14/643,034

(22) Filed: Mar. 10, 2015

(65) Prior Publication Data

US 2015/0311655 A1    Oct. 29, 2015

Related U.S. Application Data

(63) Continuation-in-part of application No. 13/953,967, filed on Jul. 30, 2013, now Pat. No. 9,202,160.

(30) Foreign Application Priority Data

Nov. 8, 2012  (KR) .......................... 10-2012-0125782
Mar. 12, 2014  (KR) .......................... 10-2014-0029122

(51) Int. Cl.
*H01R 24/00*    (2011.01)
*H04B 1/3816*    (2015.01)
(Continued)

(52) U.S. Cl.
CPC ..... *H04B 1/3816* (2013.01); *G06K 19/07739* (2013.01); *H05K 5/0247* (2013.01);
(Continued)

(58) Field of Classification Search
CPC .. G06K 19/07737; H01R 27/00; H01R 31/06; H01R 27/02; H01R 23/6873
(Continued)

(56) References Cited

U.S. PATENT DOCUMENTS 6,050,832 A    4/2000  Lee et al.
6,768,645 B2    7/2004  Kadonaga
(Continued)

FOREIGN PATENT DOCUMENTS

JP    2009020805 A    1/2009
JP    2009217487 A    9/2009
(Continued)

OTHER PUBLICATIONS

Mar. 30, 2015 US Office Action issued in U.S. Appl. No. 13/953,967.
(Continued)

*Primary Examiner* — Abdullah Riyami
*Assistant Examiner* — Justin Kratt
(74) *Attorney, Agent, or Firm* — Harness, Dickey & Pierce, P.L.C.

(57) ABSTRACT

A memory card adapter includes a body having a set of contact pins. The set of contact pins include input pins and output pins implemented in a pin-to-pin structure. The input pins connect with pins of an inserted memory card and the output pins connect with an external socket. The body includes a bottom lead adapted to support the main body, and a top lead adapted to be combined with the bottom lead. The body includes a fixing substance adapted to combine with the contact pins. The body includes a conduction plate on a top surface or a bottom surface of the fixing substance, where the conduction plate is connected to at least one of the contact pins.

20 Claims, 25 Drawing Sheets

(51) Int. Cl.
*H05K 5/02* (2006.01)
*G06K 19/077* (2006.01)
*H01R 27/00* (2006.01)
*H01R 27/02* (2006.01)
*H01R 31/06* (2006.01)

(52) U.S. Cl.
CPC ........ *G06K 19/07737* (2013.01); *H01R 27/00* (2013.01); *H01R 27/02* (2013.01); *H01R 31/06* (2013.01)

(58) Field of Classification Search
USPC ........................................ 439/558, 660, 630
See application file for complete search history.

(56) References Cited

U.S. PATENT DOCUMENTS

| | | | |
|---|---|---|---|
| 7,094,106 B2 | 8/2006 | Yamamoto et al. | |
| 7,097,512 B1* | 8/2006 | Hsiao ............... | G06K 19/07739 439/630 |
| 7,112,074 B2 | 9/2006 | Nakai et al. | |
| 7,210,967 B1* | 5/2007 | Lee ................. | G06K 19/07743 439/630 |
| 7,249,975 B1 | 7/2007 | Liu | |
| 7,255,606 B2 | 8/2007 | Tanaka et al. | |
| 7,294,918 B2 | 11/2007 | Wada et al. | |
| 7,300,296 B1 | 11/2007 | Tanaka et al. | |
| 7,314,388 B2 | 1/2008 | Yamada et al. | |
| 7,341,194 B2 | 3/2008 | Lin | |
| 7,357,676 B2 | 4/2008 | Ecker et al. | |
| 7,357,677 B2 | 4/2008 | Liu | |
| 7,371,119 B1 | 5/2008 | Lee | |
| 7,405,470 B2 | 7/2008 | Iwasaki | |
| 7,410,376 B2 | 8/2008 | Ying et al. | |
| 7,411,284 B2 | 8/2008 | Iwasaki | |
| 7,425,157 B1* | 9/2008 | Hung ............... | G06K 19/07741 439/630 |
| 7,427,026 B2 | 9/2008 | Kojima et al. | |
| 7,427,032 B2 | 9/2008 | Osako et al. | |
| 7,489,027 B2 | 2/2009 | Iwasaki | |
| 7,659,607 B2 | 2/2010 | Iwasaki | |
| 7,768,111 B2 | 8/2010 | Iwasaki | |
| 7,847,712 B2 | 12/2010 | Chen et al. | |
| 8,102,658 B2 | 1/2012 | Hiew et al. | |
| 2007/0274033 A1* | 11/2007 | Hwang ............. | G06F 1/186 361/679.32 |
| 2010/0105251 A1 | 4/2010 | Hiew et al. | |

FOREIGN PATENT DOCUMENTS

| | | |
|---|---|---|
| KR | 100799439 B1 | 1/2008 |
| KR | 100818015 B1 | 3/2008 |
| KR | 101002739 B1 | 12/2010 |
| KR | 20110124808 A | 11/2011 |

OTHER PUBLICATIONS

SD Association, SD Input/Output (SDIO) Card Specification, Version 1.00, Oct. 2001, pp. 1-29.

* cited by examiner

MEMORY CARD ADAPTER

CROSS-REFERENCE TO RELATED APPLICATIONS

This application is a continuation in part application of U.S. application Ser. No. 13/953,967 filed on Jul. 30, 2013, and which claims priority to Korean Patent Application No. 10-2012-0125782 filed on Nov. 8, 2012 in the Korean Intellectual Property Office, the entire contents of each of which are hereby incorporated by reference. The present application claims priority under 35 U.S.C. §119 to Korean Patent Application No. 10-2014-0029122 filed Mar. 12, 2014, in the Korean Intellectual Property Office, the entire contents of which is hereby incorporated by reference.

BACKGROUND

The inventive concepts described herein relate to a memory card adapter.

Various types of memory devices (e.g., a nonvolatile memory device) used as auxiliary storage devices of portable devices (e.g., a cellular phone, a digital camera, tablet personal computer, etc.) may be fabricated together with technical development of storage medium. For example, the memory devices may include a compact flash, a multimedia card (MMC), a smart media card (SMC), a secure digital (SD) card, and on other like memory devices.

Standards of the memory card may be various. Additionally, memory cards may have different shapes and sizes according to a type of each of the memory cards. For this reason, adapters may be required to receive memory cards having various shapes and sizes.

SUMMARY

At least one example embodiment relates to a memory card adapter.

According to an example embodiment of the inventive concepts is directed to a memory card adapter including a body having a set of contact pins, the set of contact pins including input pins and output pins implemented in a pin-to-pin structure. The input pins are configured to connect with pins of a memory card and the output pins are configured to connect with an external socket. The body includes a fixing substance configured to combine with at least some contact pins of the set of contact pins. The body includes a conduction plate on one of a top surface and a bottom surface of the fixing substance, the conduction plate being connected to at least one contact pin of the set of contact pins to form a return path.

At least one example embodiment provides that the memory card adapter further includes a bottom lead configured to support the body and a top lead configured to be combined with the bottom lead.

At least one example embodiment provides that a number of the input pins is equal to a number of the output pins.

At least one example embodiment provides that at least two of the output pins are supplied with a ground voltage, and the at least two output pins are electrically connected.

At least one example embodiment provides that the set of contact pins includes a ground pin and the conduction plate is connected to the ground pin.

At least one example embodiment provides that the conduction plate includes a set of protrusions, and the fixing substance includes a first groove configured to receive a first protrusion of the set of protrusions, the fixing substance being engaged with the conduction plate when the conduction plate is connected to one of the output pins that corresponds to the ground pin; and a second groove configured to receive a second protrusion of the set of protrusions, the fixing substance being engaged with the conduction plate when the conduction plate is connected to one of the input pins that corresponds to the ground pin.

At least one example embodiment provides that the conduction plate is connected to a first pin and a second pin from among the contact pins, the first pin and the second pin being supplied with a ground voltage.

At least one example embodiment provides that the conduction plate includes a set of protrusions, and the fixing substance includes a first groove configured to receive a first protrusion of the set of protrusions, the fixing substance being engaged with the conduction plate when the conduction plate is connected to one of the output pins that corresponds to the second pin; a second groove configured to receive a second protrusion of the set of protrusions, the fixing substance being engaged with the conduction plate when the conduction plate is connected to one of the input pins that corresponds to the second pin; and a third groove configured to receive a third protrusion of the set of protrusions, the fixing substance being engaged with the conduction plate when the conduction plate is connected to one of the output pins that corresponds to the first pin.

At least one example embodiment provides that, when the conduction plate is on the top surface of the fixing substance, the conduction plate includes a first protrusion on the top surface of the fixing substance, the first protrusion being connected to the at least one contact pin such that when the first protrusion is connected to the at least one contact pin, the conduction plate forms the return path, and the first protrusion has a square plate shape.

At least one example embodiment provides that the conduction plate further includes a second protrusion on the top surface of the fixing substance, the second protrusion including a slice structure, the slice structure being a strip of material projecting from the conduction plate that allows the conduction plate to connect with the fixing substance.

At least one example embodiment provides that the fixing substance comprises a slice-shaped groove configured to receive the second protrusion such that, when the second protrusion is received by the slice-shaped groove, the conduction plate is connected with the fixing substance.

At least one example embodiment provides that in the pin-to-pin structure, the input pins are arranged perpendicular to the output pins.

At least one example embodiment provides that in the pin-to-pin structure, the input pins are arranged in-line with the output pins.

At least one example embodiment provides that the memory card is a micro secure digital (SD) card.

At least one example embodiment relates to a mobile device.

According to at least one example embodiment, a mobile device includes an application processor; a communication module configured to perform wireless communications according to instructions of the application processor; a display and touch module configured to (i) receive input data and (ii) display output data according to the instructions of the application processor; a buffer RAM configured to temporarily store data generated during an operation of the application processor; a storage device configured to store program code for performing operations of an application when the program code is executed by the application processor; and a socket configured to connect pins of a memory card to the application processor. The socket includes a set of contact pins implemented in a pin-to-pin structure connected with pins of the memory card; a fixing substance configured to connect with at least a portion of the set of contact pins; and a conduction plate on one of a top surface and a bottom surface of the fixing substance, the conduction plate being connected to at least one contact pin of the set of contact pins to form a return path.

At least one example embodiment provides that the conduction plate is connected to a contact pin from among the set of contact pins that is supplied with a ground voltage.

At least one example embodiment relates to a memory card adapter.

According to at least one example embodiment, memory card adapter includes a conduction plate on a fixing substance. The conduction plate is connected to at least one contact pin of a plurality of contact pins to form a return path, and the fixing substance is engaged with at least some of the plurality of contact pins.

At least one example embodiment provides that the fixing substance is formed of an insulation material having a set of grooves, each groove of the set of grooves is configured to receive a corresponding one of a set of protrusions of the conduction plate, and when the conduction plate is connected to the at least one contact pin, each groove receives the corresponding one of the set of protrusions.

At least one example embodiment provides that the set of protrusions includes a first protrusion, the first protrusion is connected to a ground pin via a first groove of the set of grooves, the ground pin is a contact pin of the plurality of contact pins, and the ground pin is configured to receive a ground voltage.

At least one example embodiment provides that the set of protrusions includes a second protrusion, the second protrusion is connected to an input pin via a second groove of the set of grooves, the input pin is one of a plurality of input pins that correspond to the ground pin, and the input pin is connected to a memory card.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
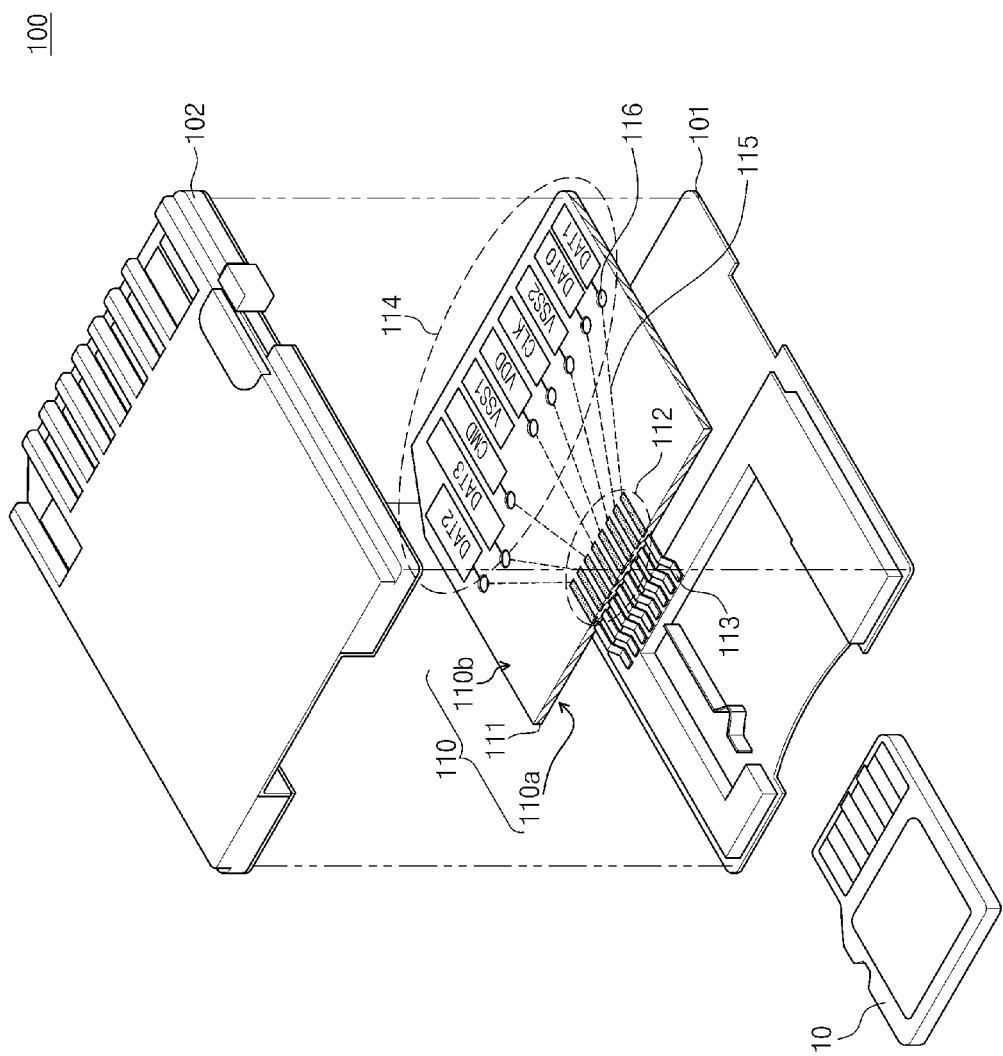
FIG. 1 is a diagram schematically illustrating a memory card adapter according to an example embodiment of the inventive concepts.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the concept of the inventive concepts to those skilled in the art. Accordingly, known processes, elements, and techniques are not described with respect to some of the embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which the inventive concepts belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A memory card adapter according to an embodiment of the inventive concepts may be suitable for a high frequency characteristic by having a return path on a signal line. Herein, the return path may be a path which has low impedance, through which a current induced by a high frequency signal flows, so as not to affect a signal line. In general, a current induced by a high frequency signal may have such a characteristic that it flows into low impedance.

FIG. 1 is a diagram schematically illustrating a memory card adapter according to an embodiment of the inventive concepts. Referring to FIG. 1, a memory card adapter 100 may include a bottom lid 101 and a top lid 102. The bottom lid 101 may fix a package substrate 110, and a memory card 10 may be physically inserted in the bottom lid 101. The top lid 102 may surround the package substrate 110 and form housing together with the bottom lid 101.

According to example embodiments, the memory card 10 may be a micro-SD card. However, the inventive concepts are not limited thereto. The memory card of the inventive concepts may be various sorts and/or types of memory cards. Below, it is assumed that the memory card 10 is a micro-SD card.

The package substrate 110 may connect the memory card 10 with an external card socket. The package substrate 110 may include a core 111 having a first surface and a second surface, a first layer 110a formed on the first surface, a second layer 110b formed on the second surface, and contact pins 113.

The core 111 may include an insulation material. For example, the core 111 may be formed of glass epoxy and/or other like insulation materials.

The first layer 110a may include contact lands 112 connected with the contact pins 113. It should be noted that the terms "lands", "contact lands", and like may refer to any type of electrical connection such as a lead, wire, pin, and/or any other like device that can enable an electrical connection. The contact lands 112 may be electrically connected with contact pads 114 through wirings 115 and via holes 116. It should be noted that the terms "via holes" and as used herein may also be referred to as "through holes" and the like. The wirings 115 may be divided into first wirings formed on the first layer 110a and second wirings formed on the second layer 110b. Herein, the first wirings may connect the contact lands 112 and corresponding via holes 116, and the second wirings may connect the contact pads 114 and corresponding via holes 116.

As illustrated in FIG. 1, each of the wirings 115 may be formed to have a straight line shape (e.g., a shortest distance) between the lands1 112/pads 114 and the via holes 115. However, the inventive concepts are not limited thereto. For example, the shapes and lengths of the wirings 115 may be modified to adjust for data skew.

According to example embodiments, the first layer 110a may have a return path on at least one signal line (e.g., DAT0, DAT1, DAT2, DAT3, CMD, or CLK). The return path may be a planar shape of a conduction area which is connected with a contact land corresponding to a power pad VDD or a ground pad VSS1/VSS2.

The second layer 110b may include the contact pads 114 that may be configured to contact with a card socket. According to various example embodiments, a size of each of the contact pads 114 may be larger than that of each of corresponding contact lands 112. According to various example embodiments, the second layer 110b may have a return path (not shown) on at least one signal line (e.g., DAT0, DAT1, DAT2, DAT3, CMD, or CLK). The return path may be a planar shaped conduction area which is connected with a contact land corresponding to a power pad VDD or a ground pad VSS1/VSS2.

According to various example embodiments, a package substrate 110 may be formed of a printed circuit board (PCB) or any other like apparatuses that may mechanically support and electronically connect electronic components.

According to various example embodiments, the memory card adapter 100 may an ultra-high speed (UHS)-dedicated adapter, secure data (SD) card adapter, or any other like memory card adapter capable of converting attributes of a memory card device such that the attributes of the memory card device may be used on an otherwise incompatible device.

In FIG. 1, routing of signal lines (e.g., DAT0 to DAT3, CMD, and CLK) of the package substrate 110 may be made using the layers 110a and 110b. However, the number of layers of the package substrate 110 need not be limited to 2 and may include multiple layers. For example, the package substrate 110 may include at least three layers for routing.

Since a return path of a signal line may be another signal line adjacent thereto, a general pin-to-pin structure of memory card adapter may not be suitable for a high-speed memory card. Also, in the general memory card adapter, it may be difficult to adjust for data skew according to limitations on physical locations of data pins DAT0 to DAT3.

On the other hand, the memory card adapter 100 according to an embodiment of the inventive concepts may include the package substrate 110 having a separate return path which allows a return path of a signal line not to be an adjacent signal line. Thus, the memory card adapter 100 may be suitable for a high-speed card operation. Further, the memory card adapter 100 according to an embodiment of the inventive concepts may include a plurality of layers 110a and 110b to route signal lines freely. Thus, it is possible to adjust for data skew of a signal line.

Figure 2:
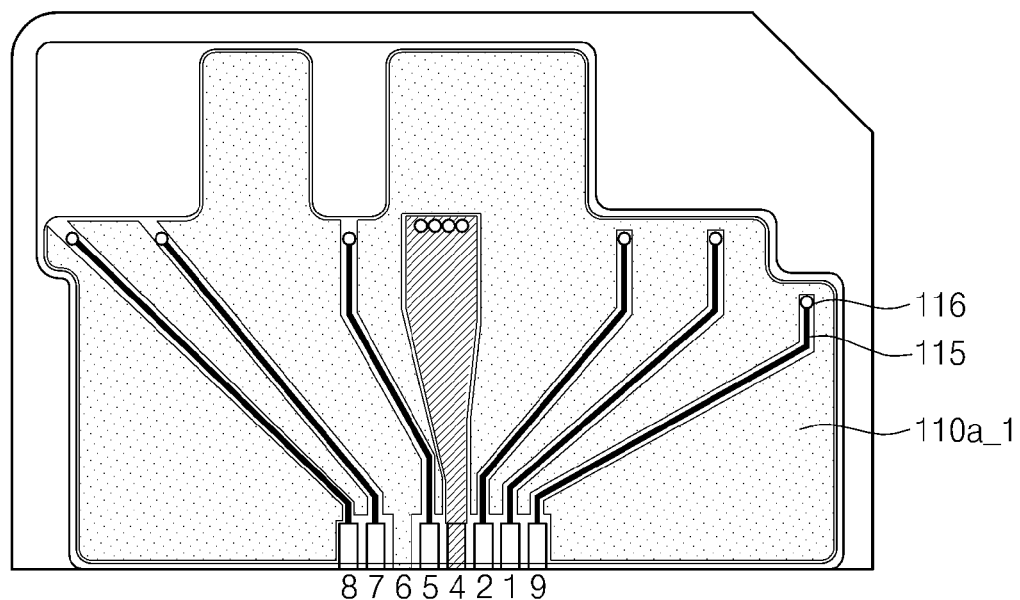
FIG. 2 is a diagram schematically illustrating a first layer of a package substrate 110 of FIG. 1 according to an example embodiment of the inventive concepts.

FIG. 2 is a diagram schematically illustrating a first layer 110a of a package substrate 110 of FIG. 1 according to an example embodiment of the inventive concepts. Referring to FIG. 2, a first layer 110a may include a planar shape of conduction area 110a_1 used as a return path. The conduction area 110a_1 may be electrically connected with a contact land 6 corresponding to a first ground pad VSS1 or a second ground pad VSS2. As illustrated in FIG. 2, the conduction area 110a_1 may not be formed at areas symmetrical to signal pads DAT0 to ~DAT3, CMD, and CLK of a second layer 110b.

Contact lands 8, 7, 5, 2, 1, and 9 corresponding to data pads DAT0 to DAT3, a command pad CMD, and a clock pad CLK, respectively, may be electrically connected with via holes through wirings. A contact land 4 corresponding to a power pad VDD may be electrically connected with a plurality of via holes through a wiring.

Figure 3:
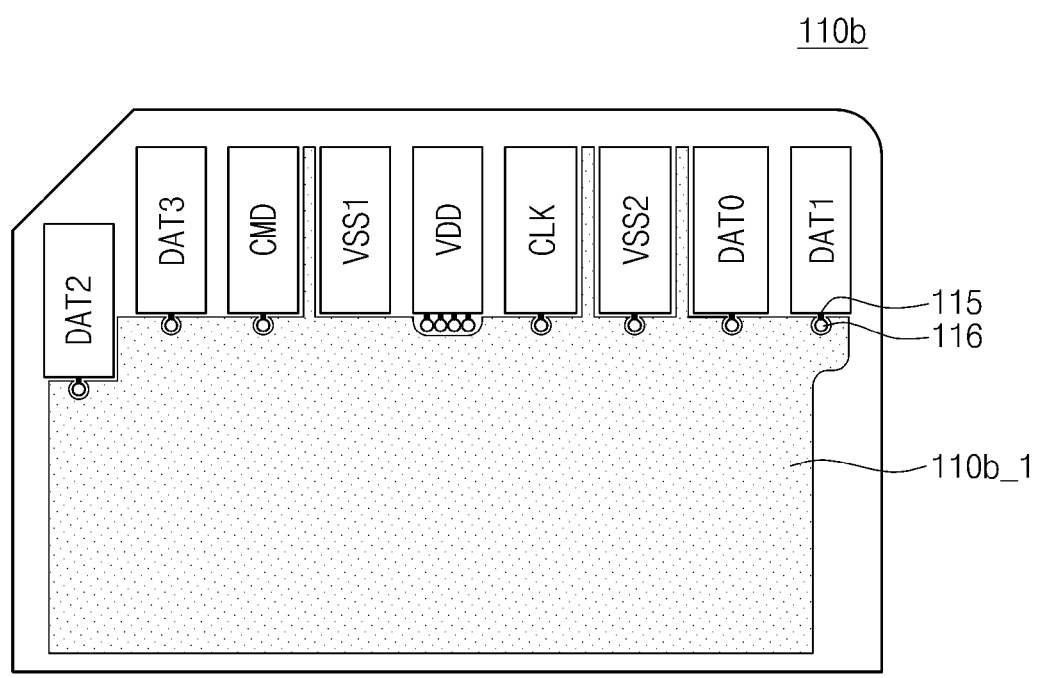
FIG. 3 is a diagram schematically illustrating a second layer of a package substrate 110 of FIG. 1 according to an example embodiment of the inventive concepts.

FIG. 3 is a diagram schematically illustrating a second layer 110b of a package substrate 110 of FIG. 1 according to an example embodiment of the inventive concepts. Referring to FIG. 3, a second layer 110b may include a conduction area 110b_1 used as a return path. The conduction area 110b_1 may be electrically connected with a first ground pad VSS1 and a second ground pad VSS2.

Data pads DAT0 to DAT3, a command pad CMD, and a clock pad CLK may be connected with via holes through wirings or without wirings. A power pad VDD may be connected with via holes through wirings or directly without wirings.

In example embodiments, the conduction area 110b_1 of the second layer 110b may be electrically connected with a conduction area 110a_1 of a first layer 110a through a plurality of via holes (not shown).

In FIG. 3, the conduction area 110b_1 used as a return path may be connected with ground pads VSS1 and VSS2. However, the inventive concepts are not limited thereto. For example, the conduction area 110b_1 used as a return path may be connected with the power pad VDD.

A package substrate according to an embodiment of the inventive concepts may further comprise a passive device for synchronization between data and a clock.

Figure 4:
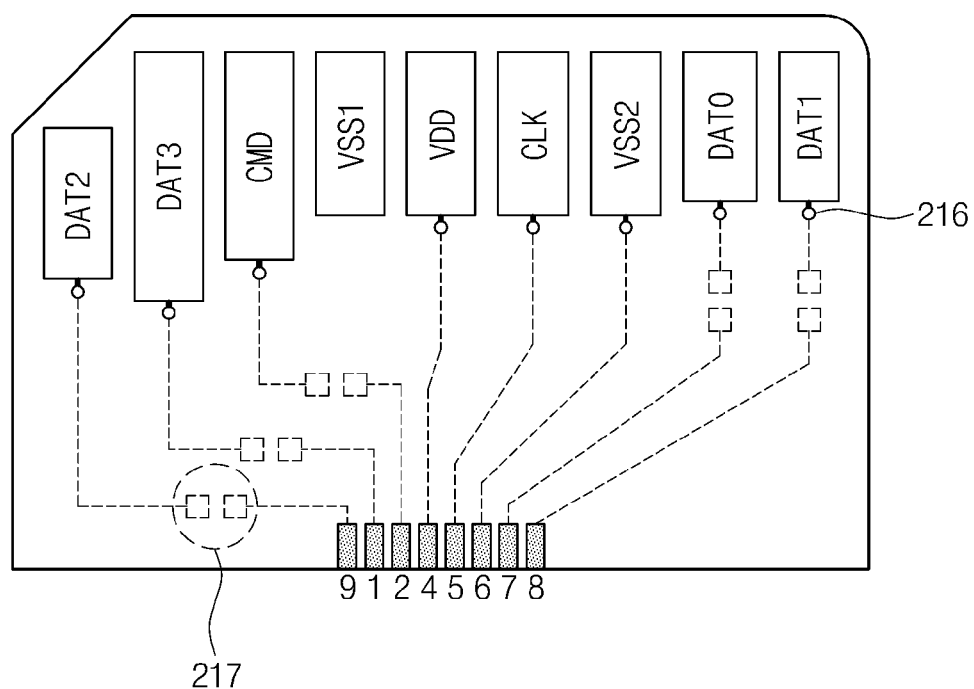
FIG. 4 is a diagram schematically illustrating a package substrate according to an example embodiment of the inventive concepts.

FIG. 4 is a diagram schematically illustrating a package substrate according to an example embodiment of the inventive concepts. Referring to FIG. 4, compared with a package substrate 110 of FIG. 1, a package substrate 210 may further comprise passive elements 217 prepared at signal lines connected with data pads DAT0 to DAT3 and a command pad CMD. The passive elements 217 may compensate for resistance and/or inductance and/or capacitance for synchronization between a clock input to a clock pad CLK and a signal input to each of the data pads DAT0 to DAT3 and the command pad CMD. According to various example embodiments, the passive elements 217 may be disposed on a first surface (e.g., a first layer 110a of FIG. 2) of the package substrate 210. Contact lands 1-9 as shown in FIG. 4 may be the same or similar to the contact lands 1-9 shown in FIG. 2. Additionally, via hole 216 may be the same or similar to via holes 116 shown in FIGS. 2-3.

The package substrate 210 according to the inventive concepts may adjust resistance and/or inductance and/or capacitance in an optimal condition by connecting at least one passive element 217 with at least one signal line.

The package substrate 210 according to various example embodiments of the inventive concepts may be capable of routing between a first layer and a second layer to adjust a signal length for setting of data skew.

Figure 5:
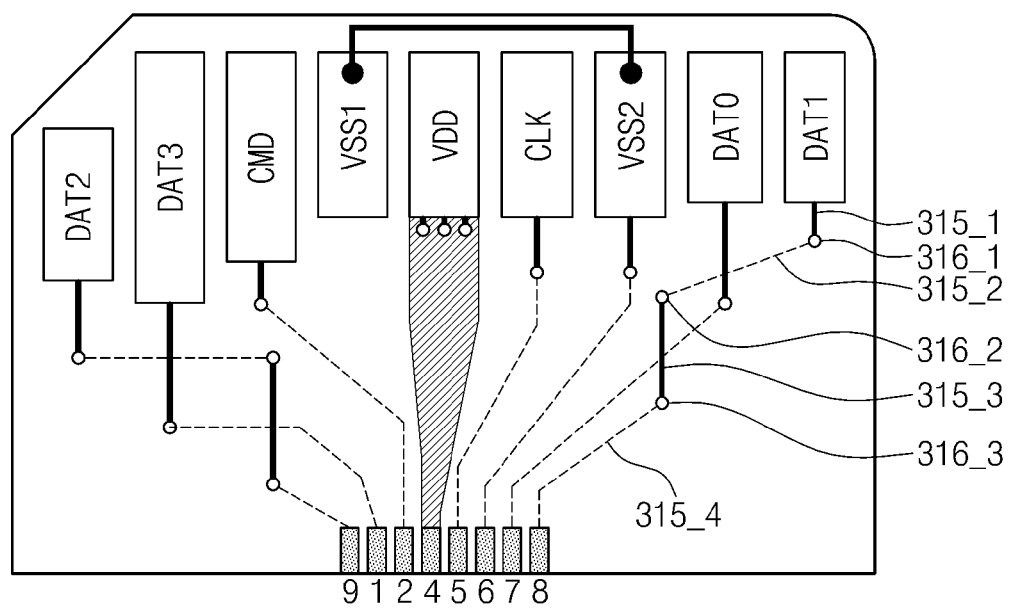
FIG. 5 is a diagram schematically illustrating a package substrate according to an example embodiment of the inventive concepts.

FIG. 5 is a diagram schematically illustrating a package substrate according to an example embodiment of the inventive concepts. Referring to FIG. 5, a package substrate 310 may adjust a signal length of each of data pads DAT0 to DAT3 through physical routing using via holes to set data skew. Contact lands 1-9 as shown in FIG. 5 may be the same or similar to the contact lands 1-9 shown in FIGS. 2 and 4.

A signal line corresponding to a data pad DAT1 as shown by FIG. 5 will be described. Three via holes 316_1, 316_2, and 316_3 and four wirings 315_1, 315_2, 315_3, and 315_4 may be used to connect a data pad DAT1 of a second layer (e.g., second layer 110b of FIG. 3) and a contact land 8 of a first layer (e.g., first layer 110a of FIG. 2) electrically. The first wiring 315_1 may be formed at the second layer 110b to connect the data pad DAT1 and a first via hole 316_1, and the second wiring 315_2 may be formed at the first layer 110a to connect the first via hole 316_1 and the second via hole 316_2. The third wiring 315_3 may be formed at the second layer 110b to connect the second via hole 316_2 and the third via hole 316_3, and the fourth wiring 315_4 may be formed at the first layer 110a to connect the third via hole 316_3 and a contact land 8.

The package substrate 310 according to an example embodiment of the inventive concepts may adjust a signal length by connecting a signal pad DAT0/DAT1/DAT2/DAT3/CMD/CLK with a corresponding contact land using at least two via holes.

The package substrate 310 according to various example embodiments of the inventive concepts may have a plurality of signal lines for connecting a signal pad and a contact pad, and may connect a signal pad and a contact land through one of the plurality of signal lines.

Figure 6:
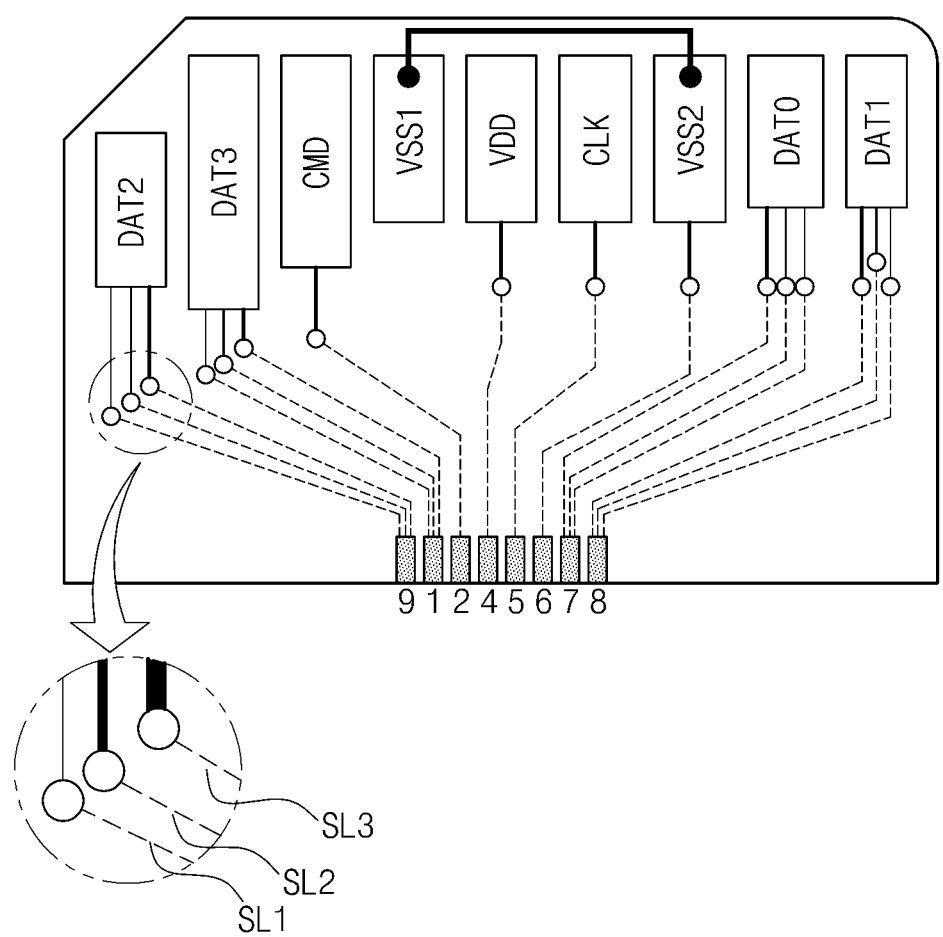
FIG. 6 is a diagram schematically illustrating a package substrate according to an example embodiment of the inventive concepts.

FIG. 6 is a diagram schematically illustrating a package substrate according to an example embodiment of the inventive concepts. Referring to FIG. 6, a package substrate 410 may include a plurality of signal lines SL1, SL2, and SL3 to connect data pads DAT0 to DAT3 with corresponding contact pads. Herein, the signal lines SL1, SL2, and SL3 may be formed on the package substrate 410 to have different signal characteristics according to a high frequency signal. FIG. 6 illustrates an example embodiment in which three signal lines SL1, SL2, and SL3 are formed. However, the inventive concepts are not limited thereto, and more signal lines (or fewer signal lines) may be present than are shown in FIG. 6. Contact lands 1-9 as shown in FIG. 6 may be the same or similar to the contact lands 1-9 shown in FIGS. 2 and 4-5.

A maker of a memory card adapter 100 (as discussed with respect to FIG. 1) may select one from among the signal lines SL1, SL2, and SL3 that has a suitable characteristic of a product in which the memory card adapter 100 is received, and may connect a data pad and a contact pad using the selected signal line.

The package substrate 410 of the inventive concepts may selectively connect a signal line suitable for a product.

Contact pins 113 of FIG. 1 may be shaped to be projected from a package substrate 110. However, the inventive concepts are not limited thereto. Contact pins of the inventive concepts may be implemented at a groove formed at a core of a package substrate, for example.

Figure 7:
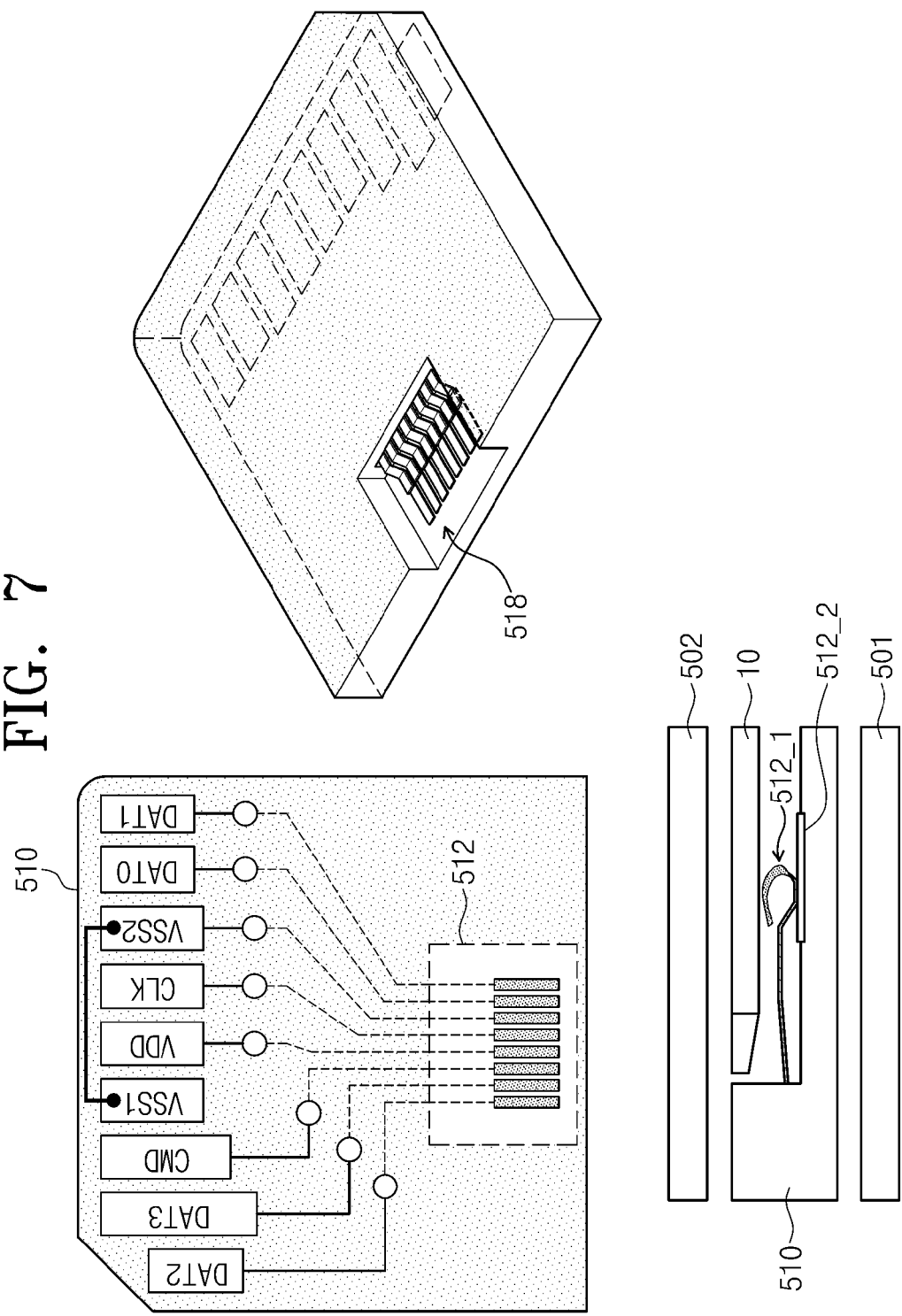
FIG. 7 is a diagram schematically illustrating a package substrate according to an example embodiment of the inventive concepts.

FIG. 7 is a diagram schematically illustrating a package substrate according to an example embodiment of the inventive concepts. Referring to FIG. 7, a package substrate 510 may have a groove 518 formed at a PCB module. Contact pins 512 may be provided in the groove 518. Each of the contact pins 512 may include a contact pin 512_1 and a fixing pad 512_2. As illustrated in FIG. 7, the package substrate 510 (i.e., the PCB module) may be surrounded by a bottom lid 501 and a top lid 502. A macro card 10 and the contact pins 512 formed at the groove 518 of the PCB module may be electrically connected by inserting the macro card 10 in the groove 518 of the PCB module.

Although not shown, a line connected with at least one of contact pads of the package substrate 510 may be routed via at least one via hole or connected with at least one passive element to synchronize a clock and data, to set data skew, and/or the like.

The inventive concepts are applicable to a memory card adapter having a pin-to-pin structure.

Figure 8:
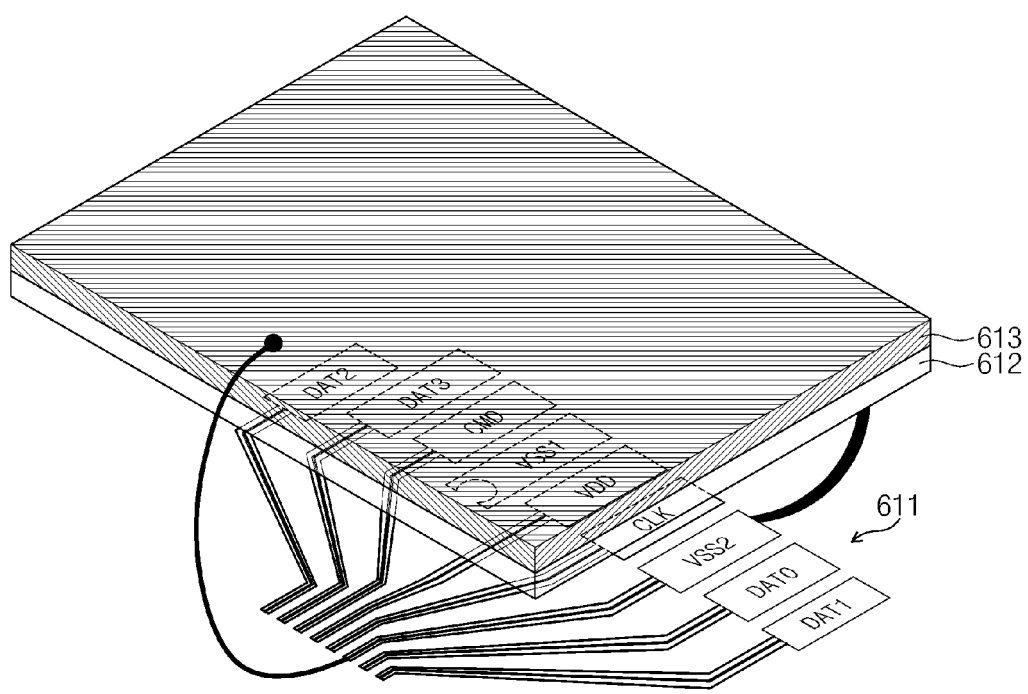
FIG. 8 is a diagram schematically illustrating a memory card adapter having a pin-to-pin structure according to an example embodiment of the inventive concepts.

FIG. 8 is a diagram schematically illustrating a memory card adapter having a pin-to-pin structure according to an example embodiment of the inventive concepts. Referring to FIG. 8, a memory card adapter 600 may include pin-to-pin structured pins 611, an insulation plate 612, and a conduction plate 613. The insulation plate 612 may be placed on the pins 611, and the conduction plate 613 may be placed on the insulation plate 612. The conduction plate 613 may be connected with a ground pin VSS2 of the pins 611. The conduction plate 613 may be used as a return path for a signal line.

According to various example embodiments, the conduction plate 613 may be connected with a pin corresponding to a ground pin VSS2 in the pin-to-pin structure.

According to various example embodiments, the conduction plate 613 may be connected with a power pin VDD.

According to various example embodiments, each of the insulation plate 612 and the conduction plate 613 may be formed to have a film shape, a flat shape, and/or any other like substantially two dimensional shape.

In FIG. 8, there is illustrated an example in which the insulation plate 612 and the conduction plate 613 are disposed on the pins 611. However, the inventive concepts are not limited thereto. For example, the insulation plate 612 and the conduction plate 613 can be disposed under the pins 611.

Figure 9:
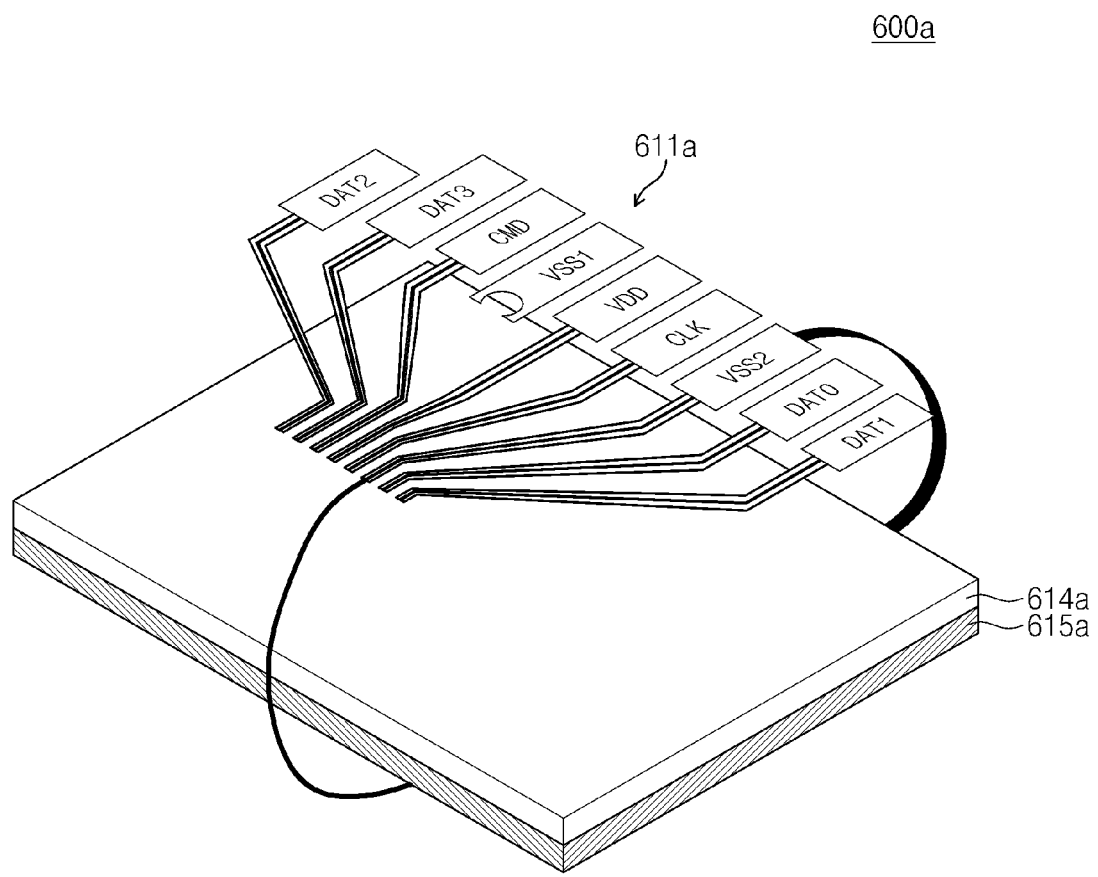
FIG. 9 is a diagram schematically illustrating a memory card adapter having a pin-to-pin structure according to an example embodiment of the inventive concepts.

FIG. 9 is a diagram schematically illustrating a memory card adapter having a pin-to-pin structure according to an example embodiment of the inventive concepts. Referring to FIG. 9, a memory card adapter 600a may include pin-to-pin structured pins 611a, an insulation plate 614a disposed under the pins 611a, and a conduction plate 615a disposed under the insulation plate 614a. According to various example embodiments, the conduction plate 615a may be directly connected with a ground pin VSS2. According to various example embodiments, the conduction plate 615a may be connected with a pin corresponding to a ground pin VSS2 in the pin-to-pin structure. Also, the insulation plate 614a and the conduction plate 615a may be disposed on and under the pins 611a.

Figure 10:
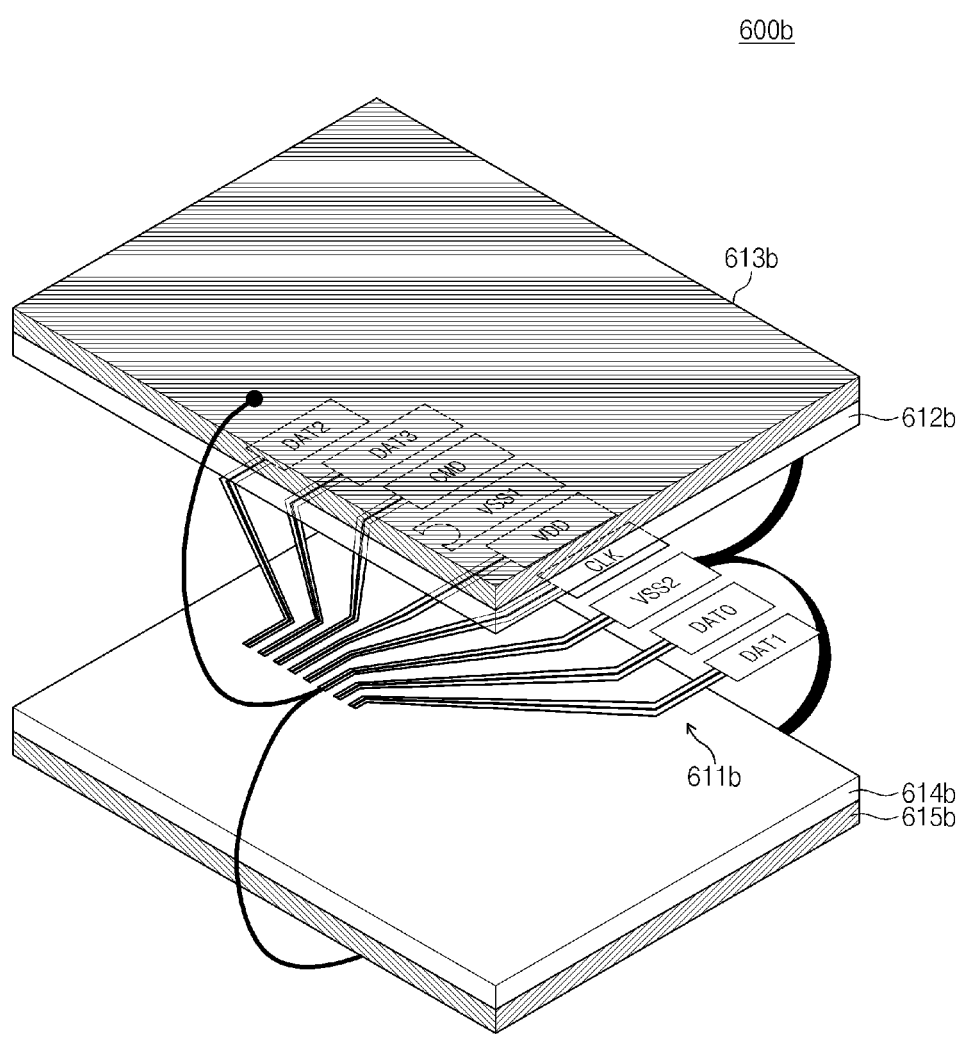
FIG. 10 is a diagram schematically illustrating a memory card adapter having a pin-to-pin structure according to an example embodiment of the inventive concepts.

FIG. 10 is a diagram schematically illustrating a memory card adapter having a pin-to-pin structure according to an example embodiment of the inventive concepts. Referring to FIG. 10, a memory card adapter 600b may include pin-to-pin structured pins 611b, a first insulation plate 612b disposed on the pins 611b, a first conduction plate 613b disposed on the first insulation plate 612b, a second insulation plate 614b disposed under the pins 611b, and a second conduction plate 615b disposed under the second insulation plate 614b.

According to various example embodiments, the conduction plates 613b and 615b may be directly connected with a ground pin VSS2. According to various example embodiments, the conduction plates 613b and 615b may be connected with a pin corresponding to a ground pin VSS2 in the pin-to-pin structure.

FIGS. 1 to 10 illustrate an example embodiment in which a conduction area used as a return path has a substrate shape. However, the inventive concepts are not limited thereto. A memory card adapter according to an embodiment of the inventive concepts may be implemented by any shape of structure having a conduction area acting as a return path of a signal line.

Figure 11:
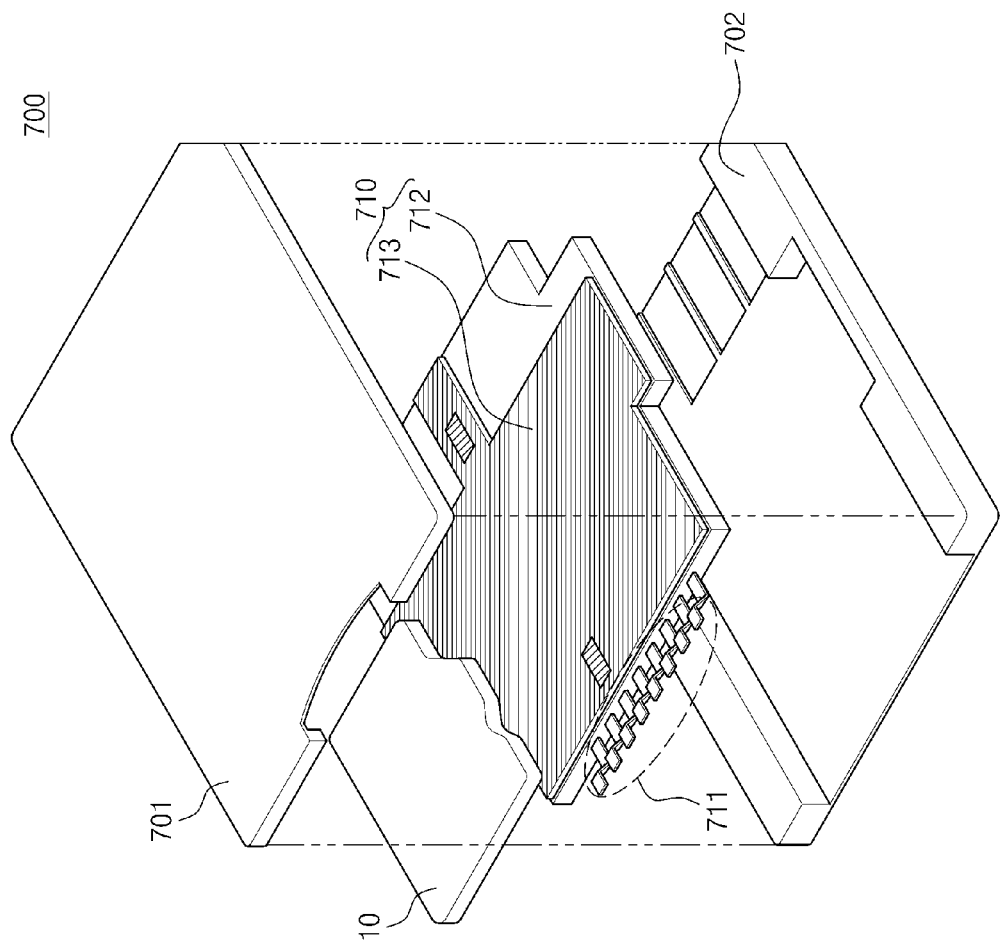
FIG. 11 is a diagram schematically illustrating a memory card adapter according to an example embodiment of the inventive concepts.

FIG. 11 is a diagram schematically illustrating a memory card adapter according to an example embodiment of the inventive concepts. Referring to FIG. 11, a memory card adapter 700 includes a bottom lead 702 and a top lead 701. A memory card 10 in physically inserted in the bottom lead 702, and a main body 710 is fastened by the bottom lead 702. The top lead 701 covers the main body 710 and forms a housing through a combination with the bottom lead 702.

The main body 710 contains contact pins 711 with a pin-to-pin structure, a fixing substance 712, and a conduction plate 713.

The contact pins 711 have input pins 711a (as discussed with respect to FIG. 12) connected to the memory card 10 and output pins 711b (as discussed with respect to FIG. 12) connected to an external card socket. According to various example embodiments, the number of the input pins 711a is different from that of the output pines 711b. According to various example embodiments, at least two output pins of the output pins 711b may be supplied with a ground voltage. According to various example embodiments, the number of the input pins 711a is equal to that of the output pins 711b.

The fixing substance 712 is formed of an insulation material for fastening/supporting the contact pins 711. For example, the contact pins 711 may be fastened or otherwise engaged with the fixing substance 712 by combining the contact pins 711 with at least one groove formed at the fixing substance 712. When the contact pins 711 are connected with the conduction plate 713, the conduction plate 713 engages with the fixing substrate 712.

The conduction plate 713 may be disposed on a top surface or a bottom surface of the fixing substance 712. In some example embodiments, the conduction plate 713 may be disposed on a partial area or an entire area of the fixing substance 712 by various shapes.

According to various example embodiments, the conduction plate 713 may be connected to at least one of the input pins 711 and to an output pin, corresponding to the at least one input pin, from among the output pins 711*b*. For example, the conduction plate 713 may be connected to an input pin, corresponding to a ground voltage, from among the input pins 711*a* and to at least one of VSS1, VSS2, which corresponds to a ground voltage, from among the output pins 711*b*.

Meanwhile, the conduction plate 713 of the inventive concepts may be connected to a pin for transferring a signal/voltage that necessitates a formation of a return path.

Figure 12:
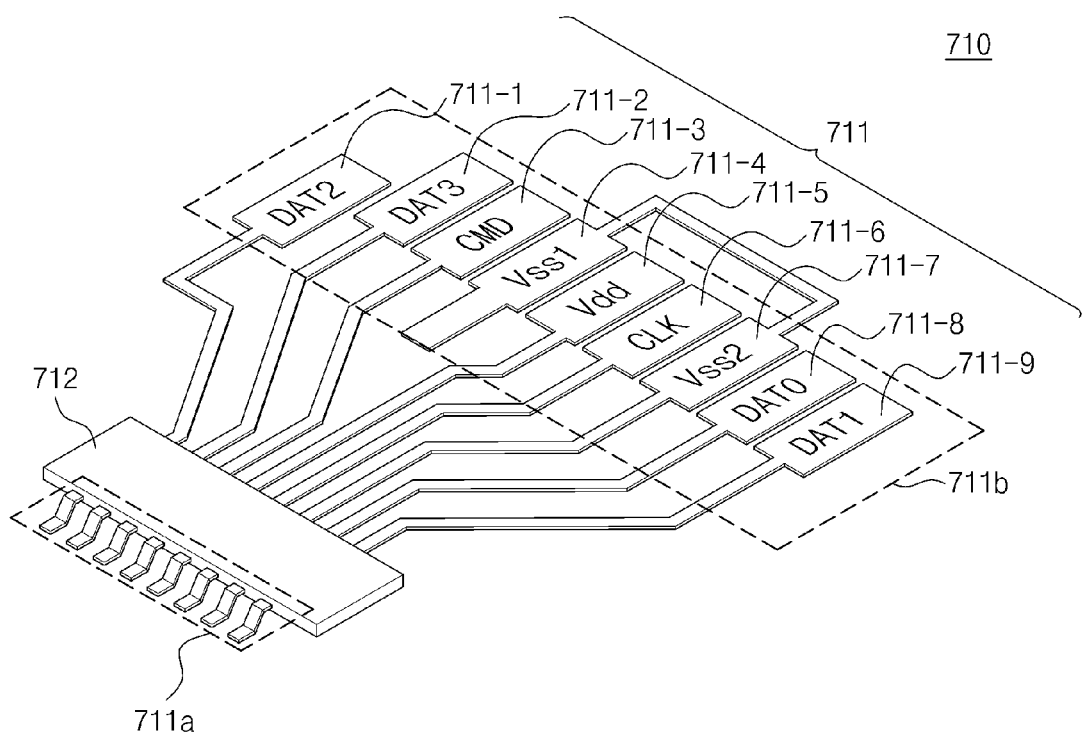
FIG. 12 is a diagram schematically illustrating a main body shown in FIG. 11, according to an example embodiment of the inventive concepts.

FIG. 12 is a diagram schematically illustrating a main body 710 shown in FIG. 11, according to an example embodiment of the inventive concepts. FIG. 12 illustrates a top surface of a main body 710. Referring to FIG. 12, the main body 710 has such a structure that each of a plurality of contact pins 711-1 to 711-9 are inserted in a corresponding groove of the fixing substance 712. Here, ground pins 711-4 and 711-6 are electrically interconnected.

According to various example embodiments, the contact pin 711-4 does not have an input pin connected to a memory card 10 and has an output pin connected to an external socket. The contact pin 711-7 is supplied with a ground voltage and includes an input pin connected to the memory card 10. Thus, the contact pin 711-7 may be referred to as a "ground pin".

Figure 13:
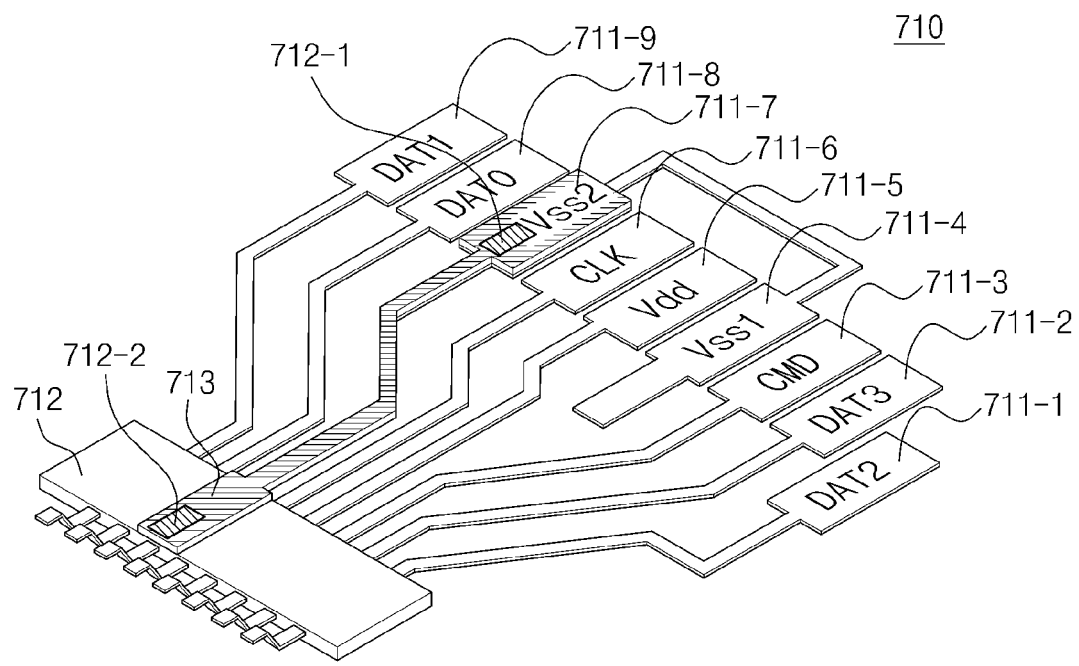
FIG. 13 is a diagram schematically illustrating a bottom surface of a main body shown in FIG. 12 according to an example embodiment of the inventive concepts.

FIG. 13 is a diagram schematically illustrating a bottom surface of a main body 710 shown in FIG. 12 according to an example embodiment of the inventive concepts. Referring to FIG. 13, a shape of a fixing substance 712 formed on a bottom surface of a main body 710 may be the same or similar to that of pins 711-1 to 711-9 and/or a conduction plate 713 that is formed on a part of the fixing substance 712. For example, the conduction plate 713 may be formed on the fixing substance 712 corresponding to a ground pin 711-7 as illustrated in FIG. 13.

According to various example embodiments, the conduction plate 713 includes a protrusion (not shown) that is connected to at least one pin (e.g., ground pin 711-7) via at least one groove (e.g., groove 712-1 or groove 712-2) of the fixing substance 712. When the protrusion of the conduction plate 713 is connected with or otherwise engaged with the contact pins 711, the protrusion of the conduction plate 713 is received by the at least one groove (e.g., groove 712-1 or groove 712-2) of the fixing substance 712. Thus, the protrusion of the conduction plate 713 engages with the at least one groove (e.g., groove 712-1 or groove 712-2) of the fixing substance 712 when the conduction plate 713 is connected with the contact pins 711. For example, the conduction plate 713 may be connected to a ground pin 711-7, supplied with a ground voltage, from among contact pins 711-1 to 711-9 as illustrated in FIG. 13. Accordingly, the fixing substance 712 may include a first groove 712-2 that receives a first protrusion of the conduction plate 713 for connecting the conduction plate 713 to the ground pin 711-7 and a second groove 712-2 that receives a second protrusion of the conduction plate 713 for connecting the conduction plate 713 to an input pin corresponding to the ground pin 711-7.

According to various example embodiments, the conduction plate 713 may be connected to a ground pin 711-4, supplied with a ground voltage, from among the contact pins 711-1 to 711-9.

It should be noted that, modification or change of a shape of the fixing substance 712 and/or a shape of the conduction plate 713 may be variously made without limitation to the example embodiments described with respect to FIGS. 12 and 13.

As shown in FIG. 13, the conduction plate 713 is connected to a ground pin 711-7. However, the inventive concepts are not limited thereto. For example, the conduction plate 713 may be connected to two ground pins 711-4 and 711-7.

Figure 14:
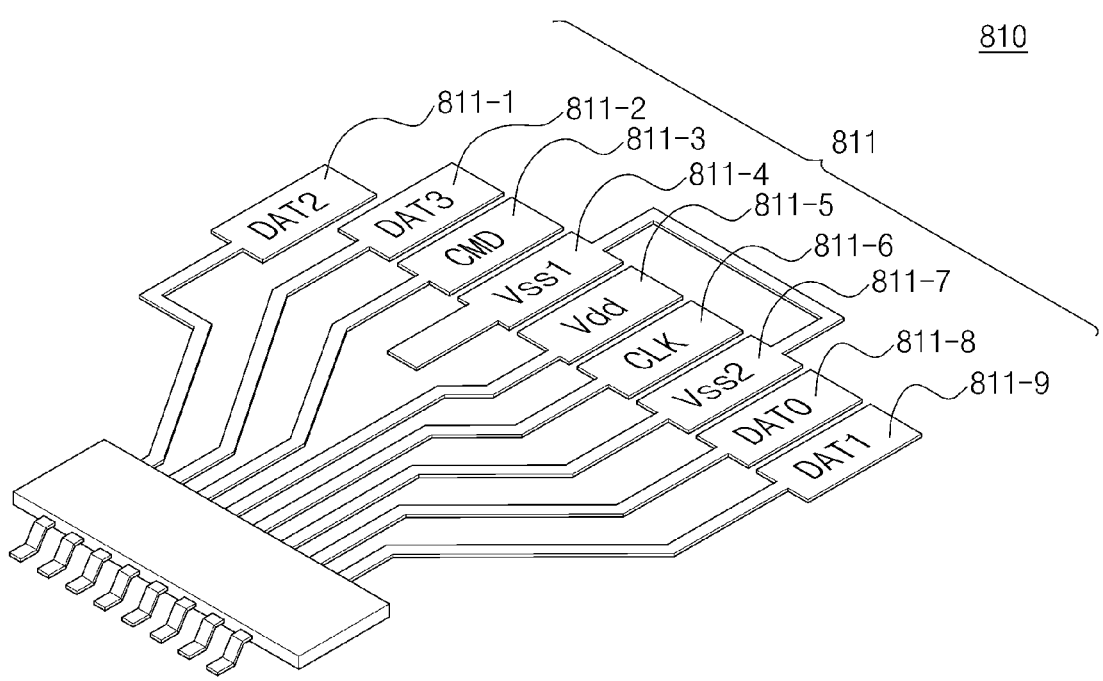
FIG. 14 is a diagram schematically illustrating a main body according to an example embodiment of the inventive concepts.

FIG. 14 is a diagram schematically illustrating a main body 810 according to an example embodiment of the inventive concepts. Referring to FIG. 14, a top surface of a main body 810 may be the same or similar to that of a main body 710 shown in FIG. 12. Furthermore, contact pins 811 may be the same or similar to contact pins 711 as shown in FIG. 12. For the sake of brevity, the same content as that of the previous example embodiments will not be repeatedly described.

Figure 15:
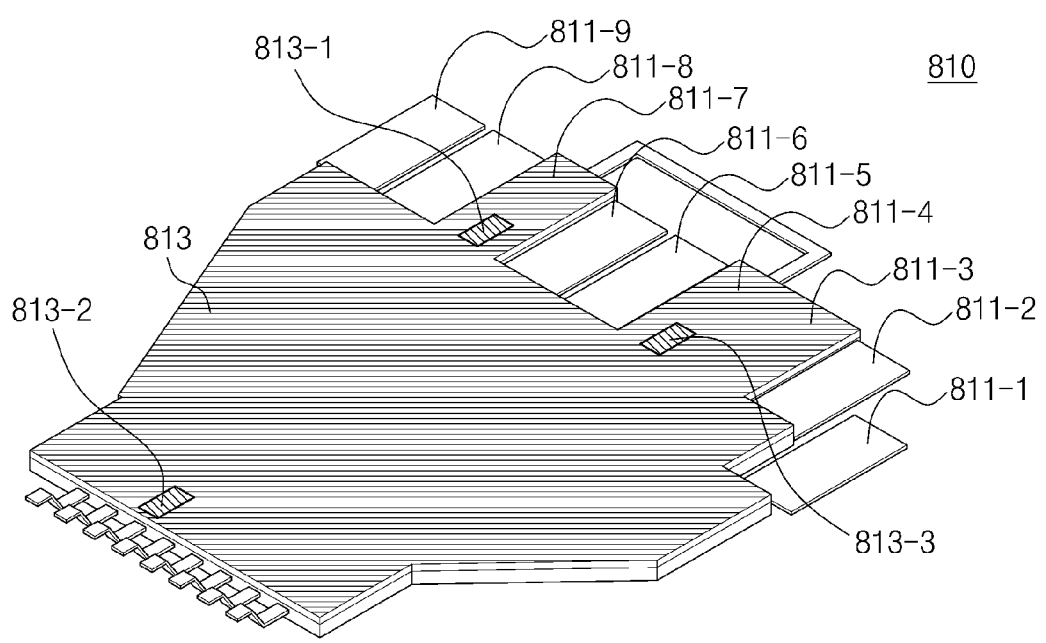
FIG. 15 is a diagram schematically illustrating a bottom surface of a main body shown in FIG. 14 according to an example embodiment of the inventive concepts.

FIG. 15 is a diagram schematically illustrating a bottom surface of a main body 810 shown in FIG. 14 according to an example embodiment of the inventive concepts. Referring to FIG. 15, a fixing substance 812 (not shown) that is formed on a bottom surface of a main body 810 is covered by a conduction plate 813, and therefore, the fixing substance 812 cannot be seen in FIG. 15.

According to various example embodiments, the fixing substance 812 has at least two grooves 812-1, 812-2, and 812-3 (not shown) for connecting the conduction plate 813 to ground pins 811-4 and 811-7. In other words, the conduction plate 813 may be connected to a first pin 811-4 and a second pin 811-7, providing a ground voltage, of contact pins 811-1 to 811-9. According to various example embodiments, the fixing substance 812 contains a first groove 812-1 for connecting a first protrusion 813-1 of the conduction plate 813 to an output pin corresponding to the second pin 811-7, a second groove 812-2 for connecting a second protrusion 813-2 of the conduction plate 813 to an input pin corresponding to the second pin 811-7, and a third groove 812-3 for connecting a third protrusion 813-3 of the conduction plate 813 to the first pin 811-4.

The conduction plate 813 may be formed on an entire area of the fixing substance 812 as shown in FIG. 15. In other example embodiments, the conduction plate 813 may be formed on a portion of the fixing substance 812 (not shown). According to various example embodiments, the conduction plate 813 may include protrusions (not shown) connected to at least two pins (e.g., pins 811-4 and 811-7) via at least two of the grooves 812-1, 812-2, and 812-3 of the fixing substance 813.

According to various example embodiments, modification or change of a shape of the conduction plate 813 may be made without limitation to the example embodiments described with respect to FIG. 15. For example, a conduction plate may include at least one protrusion allowing for an easy combination with a fixing substance.

Figure 16:
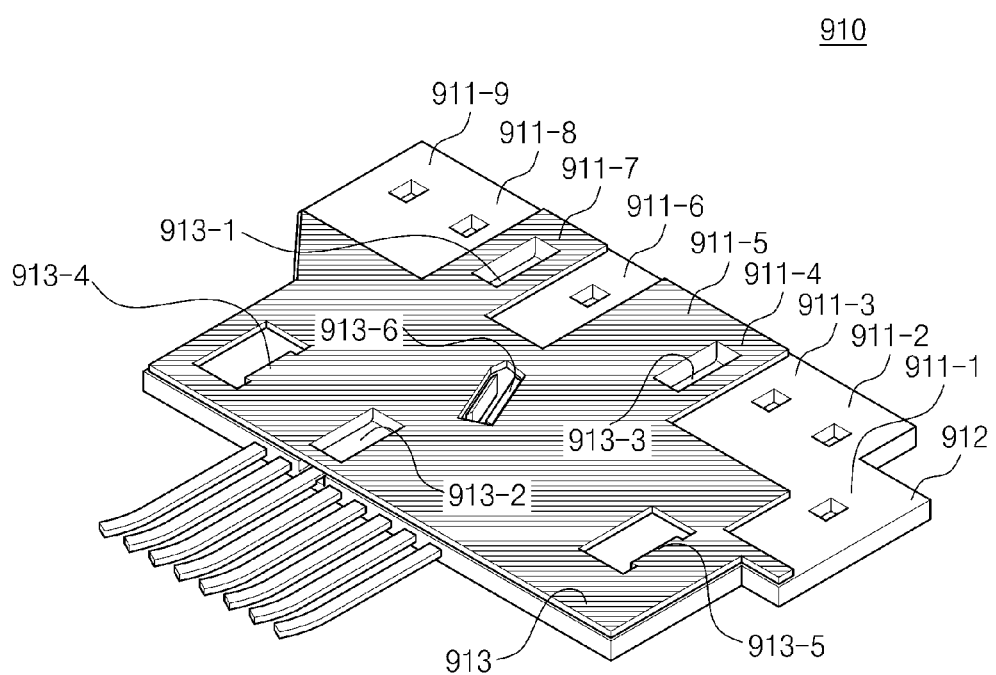
FIG. 16 is a diagram schematically illustrating a main body according to an example embodiment of the inventive concepts.
Figure 17:
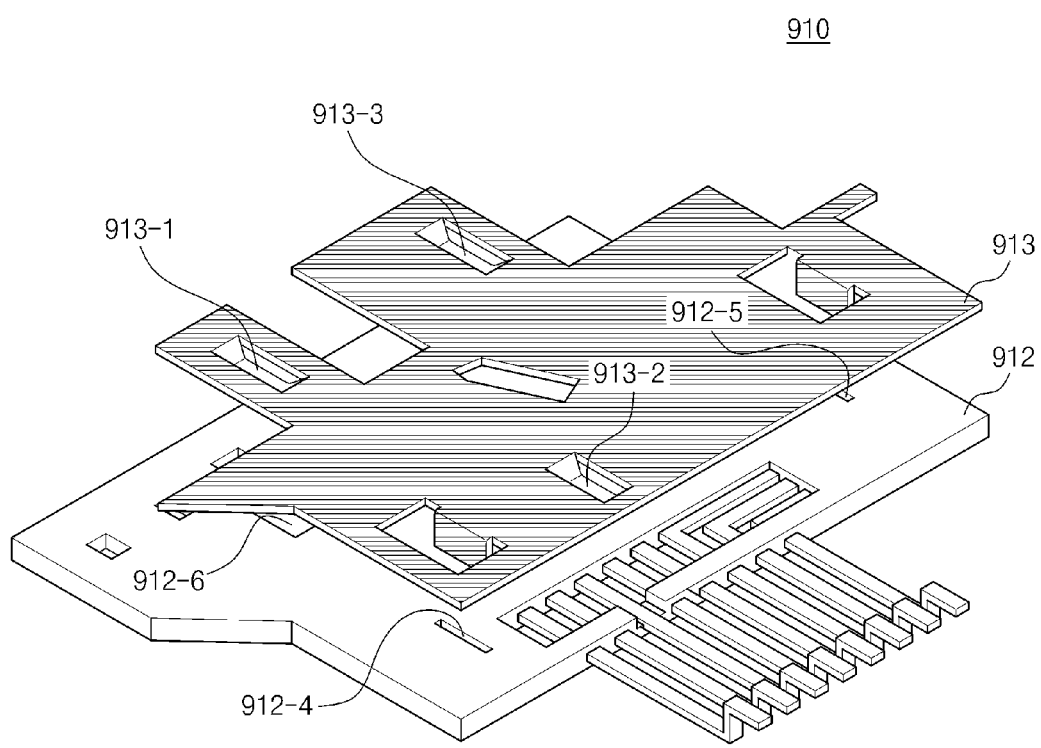
FIG. 17 is a diagram schematically illustrating an exploded perspective view of a main body 910 shown in FIG. 16 according to an example embodiment of the inventive concepts.

FIG. 16 is a diagram schematically illustrating a main body 910 according to an example embodiment of the inventive concepts. FIG. 17 is a diagram schematically illustrating an exploded perspective view of a main body 910 shown in FIG. 16 according to an example embodiment of the inventive concepts.

Referring to FIGS. 16 and 17, a main body 910 fastens pins 911-1 to 911-9 to a fixing substance 912. A conduction plate 913 contains first protrusions 913-1, 913-2, and 913-3 for connection with ground pins 911-4 and 911-7 and at least one second protrusion (e.g., one of protrusions 913-4, 913-5, and 913-6) for combining and/or connecting with the fixing substance 912.

According to various example embodiments, the first protrusions 913-1, 913-2, and 913-3 may have a sunken plate-shaped square form.

According to various example embodiments, the second protrusions 913-4, 913-5, and 913-6 may have a line-shaped slice structure that allows the conduction plate 913 to combine and/or connect with the fixing substance 912. The slice structure may be a tab, flap, and/or any other like strip of material attached to or projecting from the conduction plate that is used to connect or otherwise engage the conduction plate 913 with the fixing substance 912.

As illustrated in FIG. 17, a fixing substance 912 includes grooves 912-4, 912-5, and 912-6 combined with the second protrusions 913-4, 913-5, and 913-5. The shapes of the grooves 912-4, 912-5, and 912-6 may be dependent on shapes of the second protrusions 913-4, 913-5, and 913-5.

According to various example embodiments, the fixing substance 912 may have grooves for a combination with a top lead 701 (as described with respect to FIG. 11) or a bottom lead 702 (as described with respect to FIG. 11) to make a housing easy.

Meanwhile, contact pins with a pin-to-pin structure of the inventive concepts may be implemented to have various shapes.

Figure 18A:
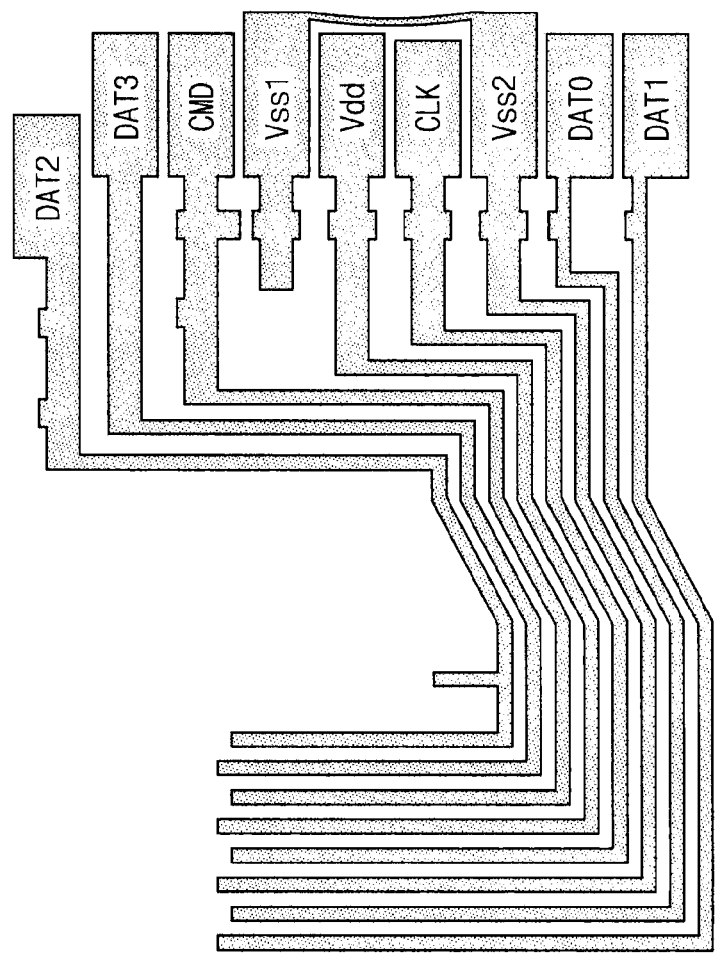
FIGS. 18A to 18C are diagrams schematically illustrating a pin-to-pin structure to be combined with a card adapter, according to an example embodiments of the inventive concepts.
Figure 18B:
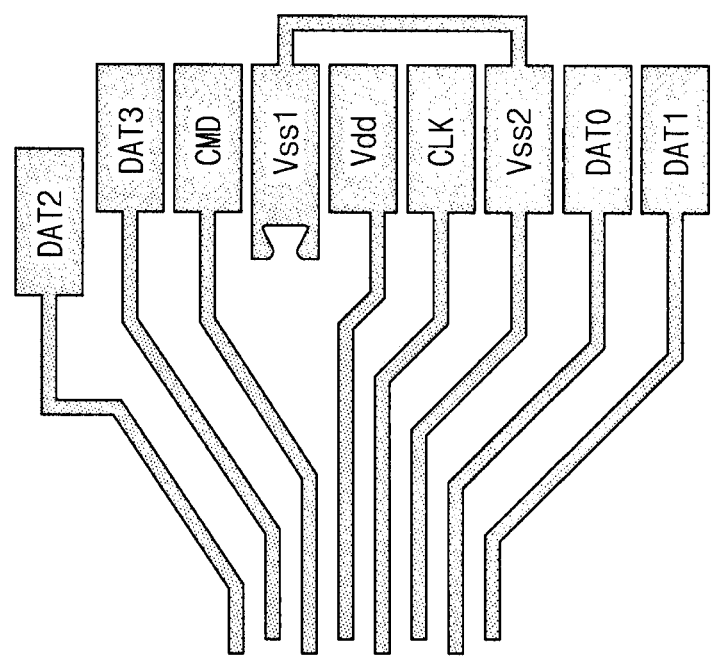
Figure 18C:
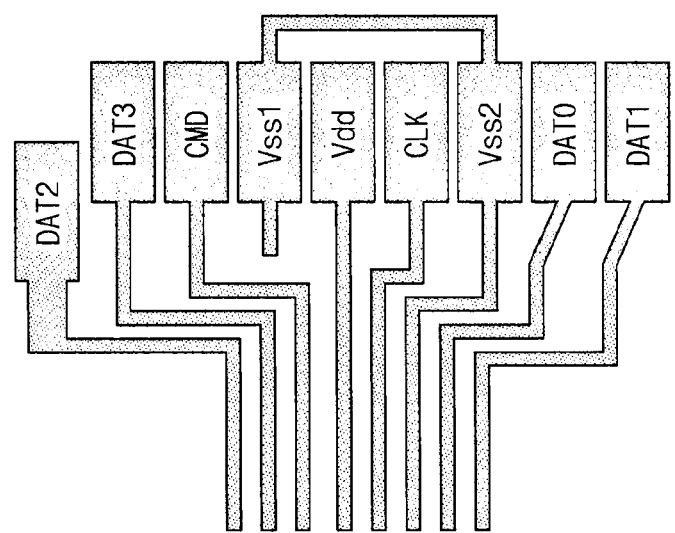

FIGS. 18A to 18C are diagrams schematically illustrating a pin-to-pin structure to be combined with a card adapter, according to an example embodiment of the inventive concepts. According to various example embodiments, in a pin-to-pin structure illustrated in FIG. 18A, an arrangement direction of input pins is vertical to that of output pins such that the input pins are perpendicular to the output pins. According to various example embodiments, in a pin-to-pin structure illustrated in FIGS. 18B and 18C, an arrangement direction of the input pins is equal to that of output pins such that the input pins are in-line with the output pins. The inventive concepts are also applicable to other pin-to-pin structures that are not shown in FIGS. 18A to 18C. For example, in some example embodiments, the arrangement direction of the input pins may be substantially parallel to the arrangement of the output pins.

With reference to FIGS. 1 to 18, example embodiments have been described in which a movable card adapter having a return path is formed on at least one signal line. However, the inventive concepts are not limited thereto. For example, the inventive concepts are also applicable to an embedded card adapter.

Figure 19:
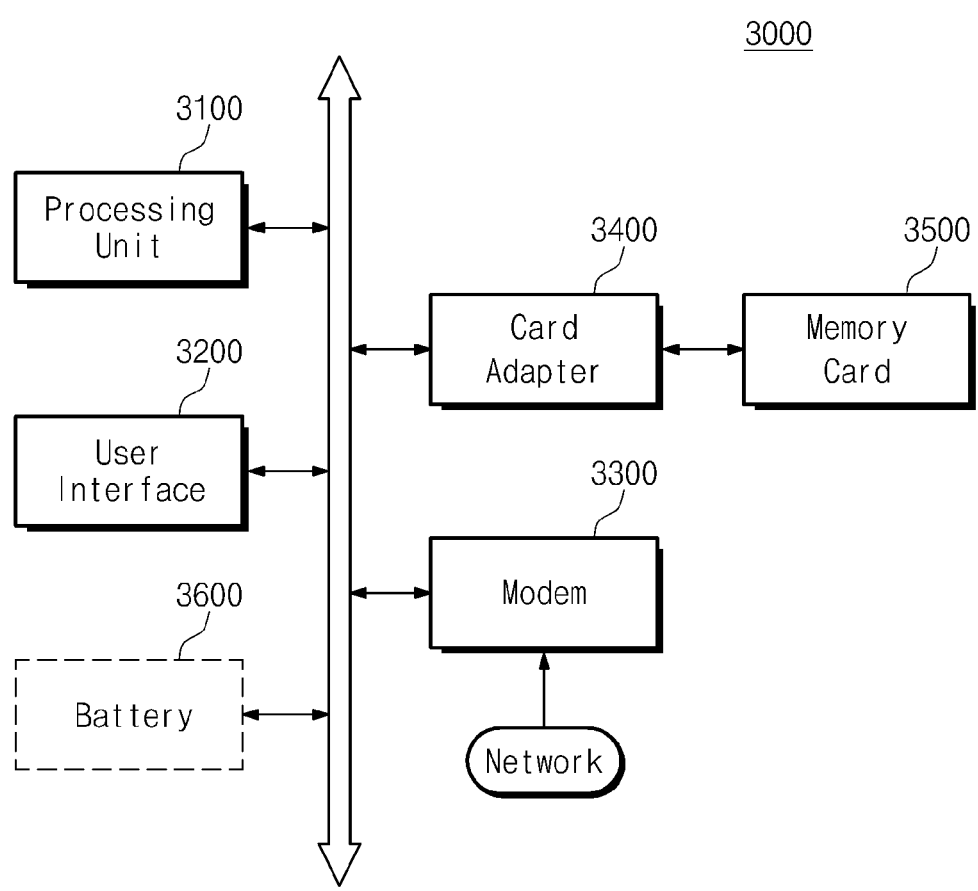
FIG. 19 is a block diagram schematically illustrating an electronic device in which a card adapter according to an example embodiment of the inventive concepts is embedded.

FIG. 19 is a block diagram schematically illustrating an electronic device in which a card adapter is embedded according to an example embodiment of the inventive concepts. Referring to FIG. 19, an electronic device 3000 contains at least processing unit 3100, a user interface 3200, a modem 3300, a card adapter 3400, and a storage device 3500. The card adapter 3400 may be implemented to have a return path on at least one signal line.

The electronic device 3000 may be a desktop computing device, a PDA, a portable computer, a tablet personal computer, a wireless phone, a mobile phone, a digital music player, a memory card, or any other like device capable of transmitting and receiving information at a wired and/or wireless network.

Data processed and/or schedule to be processed by the processing unit 3100 may be stored in the card adapter 3400 when the memory card 3500 is connected with the card adapter 3400. The data processed and/or schedule to be processed by the processing unit 3100 may be stored a local storage device, such as a random access memory (RAM), read only memory (ROM), or any other like high-speed storage device capable of storing and recording data. The processing unit 3100 may be any hardware device configured to carry out instructions of a computer program by performing the basic arithmetical, logical, and input/output operations. The processing unit 3100 may perform a variety of functions for electronic device 3000 and may process data by executing program code, one or more software modules, firmware, middleware, microcode, hardware description languages, and/or any other like set of instructions stored in the memory 3500. The card adapter 3400 may be configured substantially the same as the example embodiments as described with reference to FIGS. 1 to 18. The memory card 3500 may be a removable memory device, such as a secure digital (SD) card, a mini SD card, a micro SD card, a flash card, a compact flash card, a memory stick, an intelligent stick, a multimedia card (MMC), a smart media card, and the like. The memory card 3500 may provide an additional storage space for the processing unit 3100. The memory card 3500 may be the same or similar to memory card 10 as discussed with regard to FIGS. 1 and 11-12. When the card adapter 3400 receives or is otherwise connected with the memory card 3500, the card adapter 3400 is configured to connect pins of the memory card 3500 to the processing unit 3100, such that program code and/or software modules of an application stored on the memory card 3500 may be loaded into the processing unit 3100 to be executed.

In example embodiments where the electronic device 3000 is a mobile device, the electronic device 3000 may further contain a battery 3600 for supplying an operation voltage of a user device. Although not shown, electronic device 3000 may further comprise an application chipset, a camera image processor (CIS), a mobile DRAM, and/or other like components.

Figure 20:
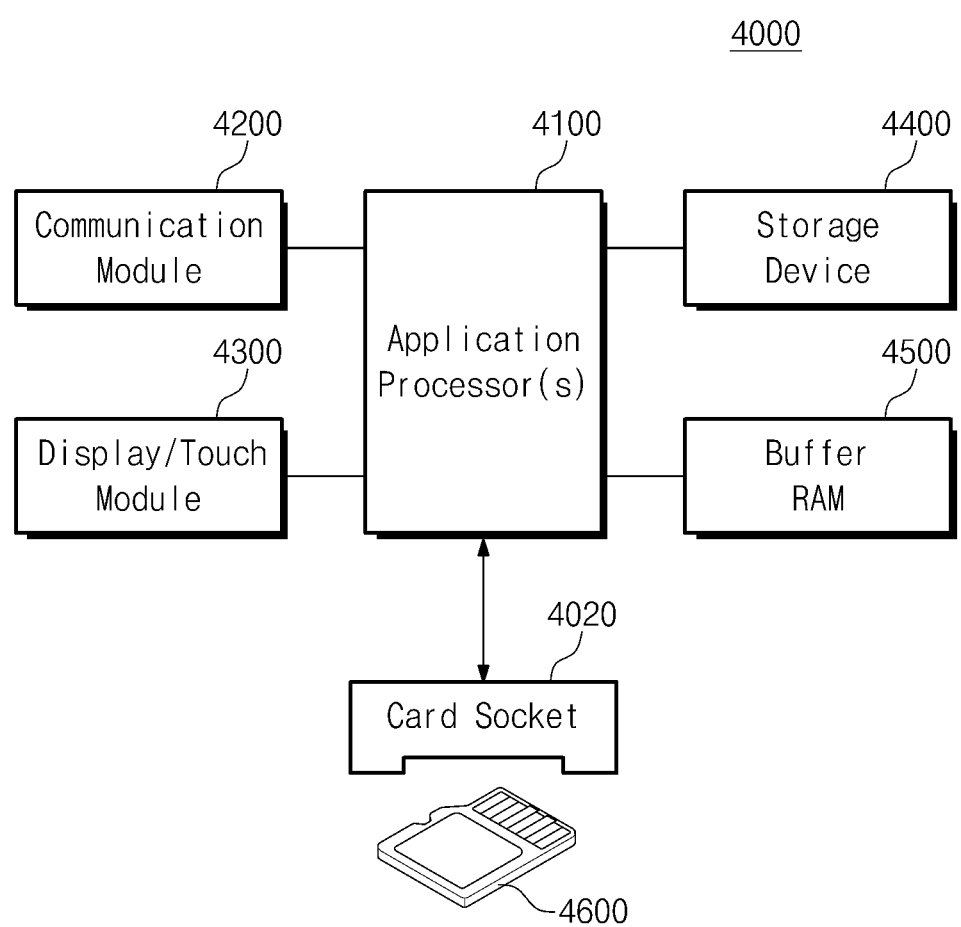
FIG. 20 is a block diagram schematically illustrating a mobile device according to an example embodiment of the inventive concepts.

FIG. 20 is a block diagram schematically illustrating a mobile device 4000 according to an example embodiment of the inventive concepts. Referring to FIG. 20, a mobile device 4000 incorporates a card socket 4020, an application processor 4100, a communication module 4200, a display/touch module 4300, a storage device 4400, and a mobile RAM 4500.

A card 4600 is inserted in the card socket 4020. The card socket 4020 is implemented to have a return path on at least one signal line according to the various example embodiments as described with reference to FIGS. 1 to 18. According to various example embodiments, the card 4600 may be any memory card, such as a secure digital (SD) card, a mini SD card, a micro SD card, a flash card, a compact flash card, a memory stick, an intelligent stick, a multimedia card (MMC), a smart media card, and the like. The memory card 4600 may be the same or similar to memory card 10 or memory card 3500 as discussed with regard to FIGS. 1, 11-12, and 19. Additionally, according to various example embodiments, the card may be a memory card with a Wi-Fi function.

The application processor 4100 controls an overall operation of the mobile device 4000. The application processor 4100 may be any hardware device configured to carry out instructions of a computer program by performing the basic arithmetical, logical, and input/output operations. The application processor 4100 may perform a variety of functions for mobile device 4000 and may process data by executing program code, one or more software modules, firmware, middleware, microcode, hardware description languages, and/or any other like set of instructions stored in the storage device 4400, RAM 4500, and/or card 4600. The card socket 4020 is configured to connect pins of the memory card 4600 to the application processor 4100, such that program code and/or software modules of an application stored on the memory card 4600 may be loaded into the application processor 4100 to be executed. The communication module 4200 controls wire/wireless communications with an external device according to control signals and/or instructions of the application processor 4100. The display/touch module 4300 displays data processed by the application processor 4100 and/or receives data from a touch panel. The storage device 4400 stores program code and/or other like data that is used by the application processor 4100 for performing various operations. The storage device 4400 may be an embedded multimedia card (eMMC), a solid state drive (SSD), a universal flash storage (UFS) device, and/or any other like data storage device. The RAM 4500 is implemented to temporarily store data needed at a processing operation of the mobile device 4000.

The mobile device 4000 according to an example embodiment of the inventive concepts includes a return path on at least one signal line, thereby improving reliability of input/output data.

Figure 21:
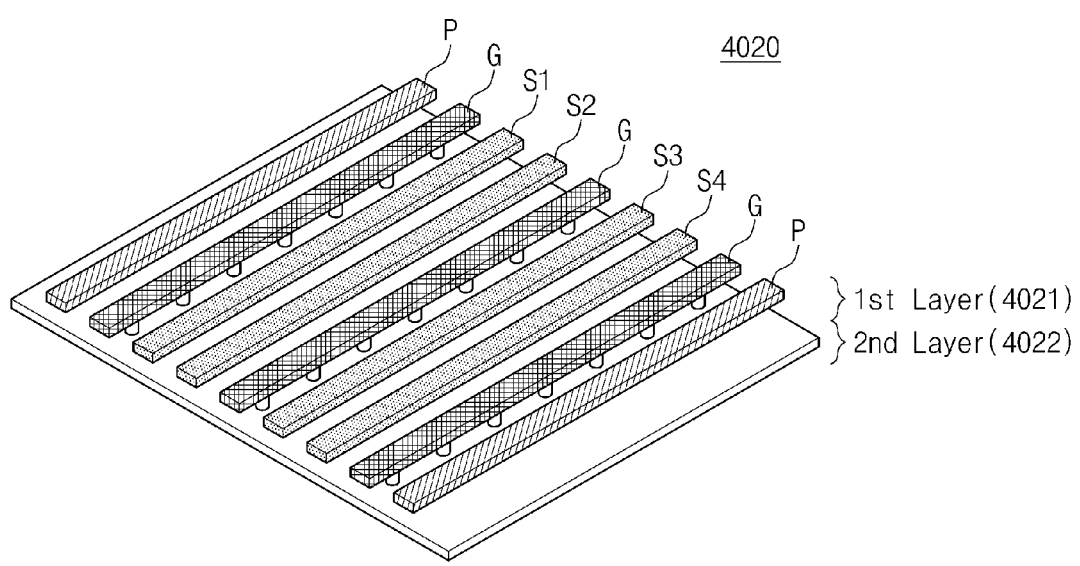
FIG. 21 is a diagram schematically illustrating a memory socket according to an example embodiment of the inventive concepts.

FIG. 21 is a diagram schematically illustrating a card socket according to an example embodiment of the inventive concepts. Referring to FIG. 21, a card socket 4020 contains a first layer 4021 and a second layer 4022.

The first layer 4021 includes at least one power pin P, at least one ground pin G, and signal pins S1, S2, S3, and S4. According to various example embodiments, the first layer 4021 may be implemented as a pin-to-pin structure.

As shown in FIG. 21, the second layer 4022 is placed under the first layer 4021. The second layer 4022 is connected with the at least one ground pin G and includes a return path. According to various example embodiments, the second layer 4022 uses a pad of a card socket 4020 and/or a pad contacting with a set board of the mobile device 4000.

According to various example embodiments, the first layer 4021 and the second layer 4022 may be implemented with 2-layer metal. According to various example embodiments, the first layer 4021 and the second layer 4022 may be implemented with 2-layer PCB substrate.

The arrangement of the power pin P, the ground pin G, and the signal pins S1 through S4 shown in FIG. 21 is exemplary. However, the scope and spirit of the inventive concepts may not be limited thereto.

Hereinafter, a memory socket implemented with 2-layer PCB is described.

Figure 22:
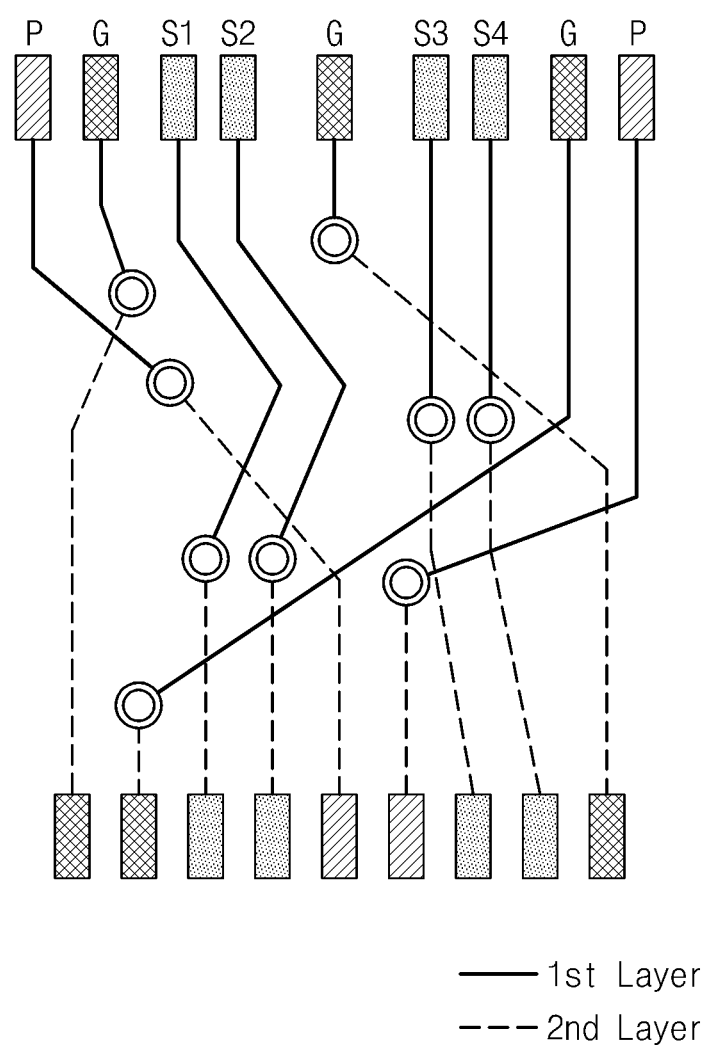
FIG. 22 is a diagram schematically illustrating a memory socket according to an example embodiment of the inventive concepts.

FIG. 22 is a diagram schematically illustrating a memory socket according to an example embodiment of the inventive concepts. It should be noted that the terms "memory socket" and "card socket" may be synonymous, and thus, the terms "memory socket" and "card socket" may be used interchangeably. Referring to FIG. 22, in a memory socket 4020a, pads P, G, and S1 through S4 contacting with a memory card (e.g., memory card 10, memory card 3500, and/or card 4600 as discussed with regard to FIGS. 1, 11-12, and 19-20) may be connected with an internal circuit of a mobile device through at least one interconnection and/or at least one via hole between a first layer 4021 and a second layer 4022 (as discussed with regard to FIG. 21). According to various embodiments, the memory socket 4020a may be implemented as a 2-layer PCB. The memory socket 4020a according to an example embodiment of the inventive concepts may make it possible to improve the freedom of routing and to adjust timing skew of a signal line at a high-speed operation.

A decoupling capacitor and/or a passive element for adjusting data skew may be mounted on the memory socket 4020a (not shown) according to an exemplary embodiment of the inventive concepts to secure the reliability of power.

Figure 23:
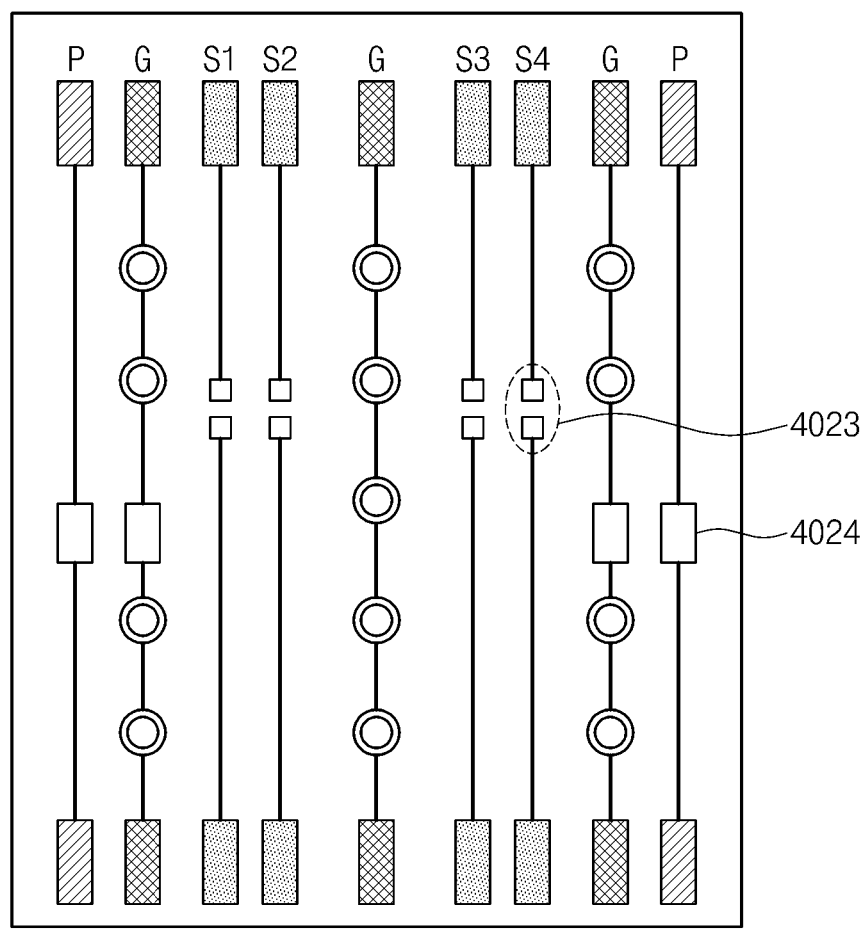
FIG. 23 is a diagram schematically illustrating a memory socket according to an example embodiment of the inventive concepts.

FIG. 23 is a diagram schematically illustrating a memory socket according to an example embodiment of the inventive concepts. According to various embodiments, the memory socket 4020b may be implemented as a 2-layer PCB. Referring to FIG. 23, in a memory socket 4020b, pads P, G, and S1 through S4 contacting with a memory card (e.g., memory card 10, memory card 3500, and/or card 4600 as discussed with regard to FIGS. 1, 11-12, and 19-20) may be connected with an internal circuit of a mobile device through at least one interconnection and/or at least one via hole between a first layer 4021 and a second layer 4022 (as discussed with regard to FIG. 21). Referring to FIG. 23, a memory socket 4020b contains at least one passive element 4023 and at least one decoupling capacitor 4024.

According to various example embodiments, the at least one passive element 4023 may be mounted to the memory socket 4020b in order to compensate for synchronization between clock and data pins.

According to various example embodiments, the at least one decoupling capacitor 4024 may be mounted to the memory socket 4020b in order to stabilize power supplied to a power pine P or a ground pin G.

According to various example embodiments, the ground pin G may be connected to a return path region through a plurality of via holes.

While the inventive concepts has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A memory card adapter comprising:
   a body including,
   a set of contact pins, the set of contact pins including input pins and output pins implemented in a pin-to-pin structure,
   the input pins are configured to connect with pins of a memory card, and
   the output pins are configured to connect with an external socket;
   a fixing substance configured to combine with the set of contact pins; and
   a conduction plate on one of a top surface and a bottom surface of the fixing substance, the conduction plate being connected to at least one contact pin of the set of contact pins to form a return path and being disposed on the entire top surface area or the entire bottom surface area of the fixing substance,
   wherein the set of contact pins includes at least one ground pin.

2. The memory card adapter of claim 1, further comprising:
   a bottom lead configured to support the body; and a top lead configured to be combined with the bottom lead.

3. The memory card adapter of claim 1, wherein a number of the input pins is equal to a number of the output pins.

4. The memory card adapter of claim 1, wherein
at least two of the output pins are supplied with a ground voltage, and
the at least two output pins are electrically connected.

5. The memory card adapter of claim 1, wherein the conduction plate is connected to the ground pin.

6. The memory card adapter of claim 5, wherein the conduction plate includes a set of protrusions, and the fixing substance comprises:
a first groove configured to receive a first protrusion of the set of protrusions, the fixing substance being engaged with the conduction plate when the conduction plate is connected to one of the output pins that corresponds to the ground pin; and
a second groove configured to receive a second protrusion of the set of protrusions, the fixing substance being engaged with the conduction plate when the conduction plate is connected to one of the input pins that corresponds to the ground pin.

7. The memory card adapter of claim 1, wherein the conduction plate is connected to a first pin and a second pin from among the contact pins, the first pin and the second pin being supplied with a ground voltage.

8. The memory card adapter of claim 7, wherein the conduction plate includes a set of protrusions, and the fixing substance comprises:
a first groove configured to receive a first protrusion of the set of protrusions, the fixing substance being engaged with the conduction plate when the conduction plate is connected to one of the output pins that corresponds to the second pin;
a second groove configured to receive a second protrusion of the set of protrusions, the fixing substance being engaged with the conduction plate when the conduction plate is connected to one of the input pins that corresponds to the second pin; and
a third groove configured to receive a third protrusion of the set of protrusions, the fixing substance being engaged with the conduction plate when the conduction plate is connected to one of the output pins that corresponds to the first pin.

9. The memory card adapter of claim 1, wherein, when the conduction plate is on the top surface of the fixing substance, the conduction plate comprises:
a first protrusion on the top surface of the fixing substance, the first protrusion being connected to the at least one contact pin such that when the first protrusion is connected to the at least one contact pin, the conduction plate forms the return path, and the first protrusion has a square plate shape.

10. The memory card adapter of claim 9, wherein the conduction plate further comprises:
a second protrusion on the top surface of the fixing substance, the second protrusion including a slice structure, the slice structure being a strip of material projecting from the conduction plate that allows the conduction plate to connect with the fixing substance.

11. The memory card adapter of claim 10, wherein the fixing substance comprises a slice-shaped groove configured to receive the second protrusion such that, when the second protrusion is received by the slice-shaped groove, the conduction plate is connected with the fixing substance.

12. The memory card adapter of claim 1, wherein in the pin-to-pin structure, the input pins are arranged perpendicular to the output pins.

13. The memory card adapter of claim 1, wherein in the pin-to-pin structure, the input pins are arranged in-line with the output pins.

14. The memory card adapter of claim 1, wherein the memory card is a micro secure digital (SD) card.

15. A mobile device comprising:
an application processor;
a communication module configured to perform wireless communications according to instructions of the application processor;
a display and touch module configured to (i) receive input data and (ii) display output data according to the instructions of the application processor;
a buffer RAM configured to temporarily store data generated during an operation of the application processor;
a storage device configured to store program code for performing operations of an application when the program code is executed by the application processor; and
a socket configured to connect pins of a memory card to the application processor, the socket including,
a set of contact pins implemented in a pin-to-pin structure connected with pins of the memory card;
a fixing substance configured to connect with at least a portion of the set of contact pins; and
a conduction plate on one of a top surface and a bottom surface of the fixing substance, the conduction plate being connected to at least one contact pin of the set of contact pins to form a return path and being disposed on the entire top surface area or the entire bottom surface area of the fixing substance,
wherein the set of contact pins includes at least one ground pin.

16. The mobile device of claim 15, wherein the conduction plate is connected to a contact pin from among the set of contact pins that is supplied with a ground voltage.

17. A memory card adapter, comprising:
a conduction plate on a fixing substance,
the conduction plate being connected to at least one contact pin of a plurality of contact pins to form a return path and being disposed on the entire top surface area or the entire bottom surface area of the fixing substance, and
the fixing substance being engaged with the plurality of contact pins, wherein the at least one contact pin includes a ground pin.

18. The memory card adapter of claim 17, wherein the fixing substance is formed of an insulation material having a set of grooves, each groove of the set of grooves is configured to receive a corresponding one of a set of protrusions of the conduction plate, and
when the conduction plate is connected to the at least one contact pin, each groove receives the corresponding one of the set of protrusions.

19. The memory card adapter of claim 18, wherein the set of protrusions includes a first protrusion, the first protrusion is connected to a ground pin via a first groove of the set of grooves, and the ground pin is configured to receive a ground voltage.

20. The memory card adapter of claim 19, wherein the set of protrusions includes a second protrusion, the second protrusion is connected to an input pin via a second groove of the set of grooves, the input pin is one of a plurality of input pins that correspond to the ground pin, and the input pin is connected to a memory card.

* * * * *